(12) United States Patent
Shinagawa

(10) Patent No.: US 7,768,138 B2
(45) Date of Patent: Aug. 3, 2010

(54) SEMICONDUCTOR DEVICE

(75) Inventor: Masatoshi Shinagawa, Shiga (JP)

(73) Assignee: Panasonic Corporation, Osaka (JP)

( * ) Notice: Subject to any disclaimer, the term of this patent is extended or adjusted under 35 U.S.C. 154(b) by 178 days.

(21) Appl. No.: 12/212,186

(22) Filed: Sep. 17, 2008

(65) Prior Publication Data
US 2009/0101896 A1    Apr. 23, 2009

(30) Foreign Application Priority Data
Oct. 23, 2007    (JP)    ............................. 2007-275021
Apr. 15, 2008    (JP)    ............................. 2008-105487

(51) Int. Cl.
*H01L 23/48*    (2006.01)
(52) U.S. Cl. ...................... 257/786; 257/773; 257/776; 257/780; 257/781; 257/784; 257/E23.001; 257/E23.011; 257/E23.015; 257/E23.02; 257/E23.021; 257/E23.143; 361/679.06; 361/679.07; 174/542
(58) Field of Classification Search ......... 257/691–695, 257/734–786, 797, E23.001, E23.011, E23.015, 257/E23.02, E23.021, E23.143; 361/679.06, 361/679.07, 755; 174/542
See application file for complete search history.

(56) References Cited
U.S. PATENT DOCUMENTS

| 5,440,453 | A | * | 8/1995 | Cooke et al. ................. 361/790 |
| 5,700,975 | A | * | 12/1997 | Takata et al. ................. 174/548 |
| 5,973,930 | A | | 10/1999 | Ikeda et al. |
| 6,051,886 | A | * | 4/2000 | Fogal et al. .................. 257/777 |
| 6,335,491 | B1 | | 1/2002 | Alagaratnam et al. |
| 6,365,978 | B1 | | 4/2002 | Ibnabdeljalil et al. |
| 6,661,088 | B1 | | 12/2003 | Yoda et al. |
| 2003/0022558 | A1 | | 1/2003 | Imaoka |

FOREIGN PATENT DOCUMENTS

| JP | 2001-257307 | 9/2001 |
| JP | 2004-356284 | 12/2004 |

\* cited by examiner

*Primary Examiner*—Jasmine J Clark
(74) *Attorney, Agent, or Firm*—McDermott Will & Emery LLP

(57) ABSTRACT

In a semiconductor device, a semiconductor chip is connected to a board through an interconnection layer. A plurality of first terminals, a plurality of second terminals and a plurality of third terminals are provided on the board, the interconnection layer and the semiconductor chip, respectively. The second terminals are connected to the first terminals through the board. The third terminals are connected to the second terminals. The interconnection layer is rotatable about a rotation axis perpendicular to an upper surface of the interconnection layer. A first terminal having a specific function out of the first terminals and a third terminal having the specific function out of the third terminals are connected to each other by rotating the interconnection layer.

13 Claims, 18 Drawing Sheets

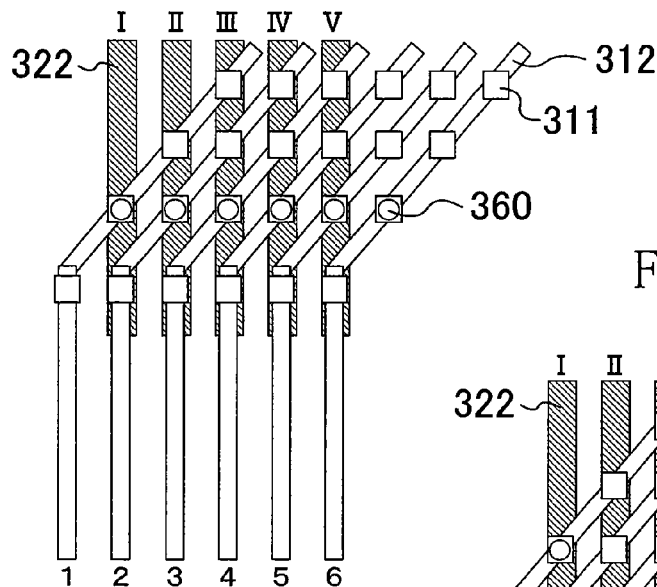
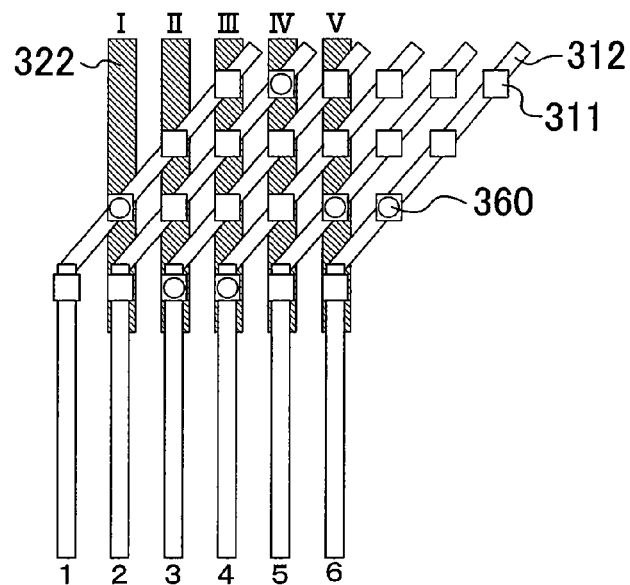
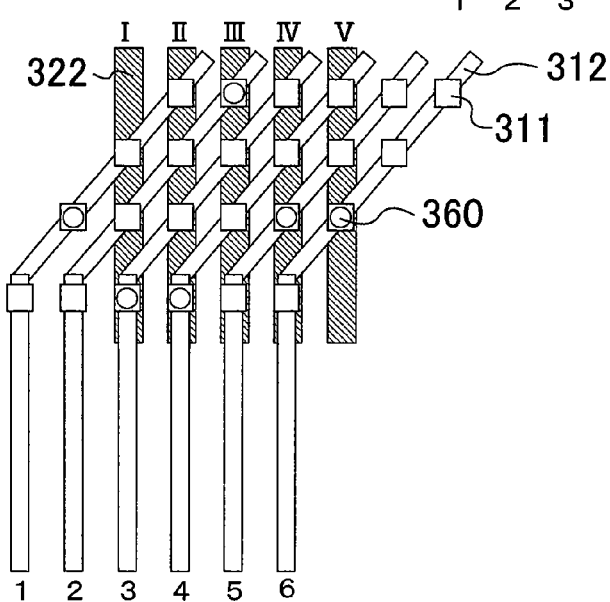

SEMICONDUCTOR DEVICE

BACKGROUND OF THE INVENTION (1) Field of the Invention

The present invention relates to cost reduction in the assembly of semiconductor devices and shortening of time necessary for developing semiconductor devices.

(2) Disclosure of Related Art

Size reduction and functional enhancement are required of various types of electronic equipment such as cellular phones and digital still cameras. With such requirements, advanced packaging techniques compatible with size reduction, increase in processing speed and increase in the number of pins of semiconductor devices are demanded. In particular, because of remarkable progress in size reduction of semiconductor chips and increase in the number of pins using system-on-a-chip (SOC) technology, it is necessary to reduce the distance between pads (terminals) on a semiconductor chip. In the assembly of a semiconductor device, pads closely provided on a semiconductor chip need to overlap pads provided on a board when viewed from above.

In a package which uses a multi-layer board of an organic material and is often used for system large scale integration (LSI) incorporated in equipment such as cellular phones and digital still cameras, if the distance between pads (terminals) on a semiconductor chip is smaller than that in conventional devices, it is difficult to form wiring in the board such that the pads on the board overlap the closely-located pads on the semiconductor chip. Thus, in such a case, an expensive special board is needed.

To solve this problem, a currently-promising approach is a two-level connection that connects a board and a semiconductor chip through an intermediate wiring layer such as a silicon interposer. Specifically, the semiconductor chip and the silicon interposer are placed such that pads provided on the semiconductor chip at a pitch finer than that in conventional devices overlap pads on the silicon interposer. The silicon interposer includes not only the pads connected to the pads on the semiconductor chip but also pads provided at a larger pitch than the pads connected to the semiconductor chip. These pads provided at a larger pitch are connected to pads on the board.

As another example of using a silicon interposer, Japanese Laid-Open Patent Publication No. 2001-257307 discloses that a silicon interposer is used as a re-wiring layer in order to increase the number of possible combinations of sizes of semiconductor chips to be laminated. In this manner, the structures of packages have advanced from a conventional structure in which a package is composed of a semiconductor chip and a board to a structure in which an intermediate wiring layer is added between a semiconductor chip and a board.

Semiconductor devices are also required to meet the following demands.

Equipment such as cellular phones takes much time and cost for development of software associated with system LSI. Thus, it is important how a plurality of types of semiconductor devices are fabricated using one semiconductor chip (system LSI), i.e., how a semiconductor chip is shared. In this circumstance, it is necessary to differentiate a function of a semiconductor device by changing only the type or arrangement of peripheral components such as a memory capacitor using a single semiconductor chip. In this case, the arrangement of solder balls (i.e., portions to which signals are transmitted) in a semiconductor device is changed according to a change of the type or arrangement of peripheral components. Since there were not many demands for conventional semiconductor devices, it is more effective to change the wiring layout of a board than to use an intermediate wiring layer as disclosed in Japanese Laid-Open Patent Publication No. 2001-257307 in changing the type or arrangement of peripheral components. However, in recent years, only the change of a wiring layout of a board at every change of the type or arrangement of peripheral components cannot meet the increasing demands for current semiconductor devices.

SUMMARY OF THE INVENTION

In sharing a semiconductor chip, one semiconductor chip has only one arrangement of solder balls (i.e., portions to which signals are transmitted) so that different boards need to be fabricated for different applications or functions of semiconductor devices. Accordingly, the cost for fabricating boards with different arrangements of solder balls increases and it takes more time to develop semiconductor devices.

It is expected that a plurality of types of semiconductor chips are provided on a board to share the board and, consequently, reduction in cost and time for development of semiconductor devices is achieved. However, it is currently difficult to carry out such a technique.

The present invention is made to solve the foregoing problems. According to the present invention, a two-level package with one or more interposing interconnection layers is employed so that a plurality of semiconductor chips are allowed to be connected to a board by rotating the interconnection layers above the upper face of the board.

In addition, for a low-cost board with low flexibility in wiring layout, even when the wiring layout of the board is changed, the arrangement of balls cannot be changed. Therefore, an expensive board must be used in order to change the arrangement of balls. However, according to the present invention, flexibility in wiring layout is increased by rotating an interconnection layer above the upper face of the board, thus allowing the use of a low-cost board.

Specifically, a semiconductor device according to the present invention includes a board, an interconnection layer, a semiconductor chip, a plurality of first terminals, a plurality of second terminals and a plurality of third terminals. The first terminals and the interconnection layer are provided on the board. The second terminals are provided on the interconnection layer and are connected to the first terminals through the board. The semiconductor chip is attached to the interconnection layer. The third terminals are provided on the semiconductor chip and are connected to the second terminals. The interconnection layer is rotatable about a rotation axis perpendicular to an upper face of the interconnection layer. A first terminal having a specific function out of the first terminals and a third terminal having the specific function out of the third terminals are connected to each other by rotating the interconnection layer.

With this structure, it is unnecessary to fabricate a board for every wiring layout of a board (e.g., a wiring board) on which a semiconductor device is to be mounted.

In a preferred embodiment of the present invention which will be described later, the second terminals are provided on one of the upper face and a lower face of the interconnection layer and are in rotational symmetry about an intersection point of the rotation axis and the interconnection layer, a plurality of first wires are provided on the board, one ends of the respective first wires are arranged in rotational symmetry about an intersection point of the rotation axis and the board, each of said one ends of the respective first wires is connected to and overlaps one of the second terminals, and each of the third terminals is connected to different ones of the first terminals between before and after rotation of the interconnection layer.

Preferably, the semiconductor device further includes a plurality of types of boards with different arrangements of the first terminals, and each of the third terminals is connected to different ones of the first terminals on each of the boards between before and after rotation of the interconnection layer.

Preferably, in the semiconductor device, the first terminals are provided on a lower face of the board and are composed of at least one first power supply terminal and at least one first signal terminal, the second terminals are provided on the upper face of the interconnection layer and are composed of at least one second power supply terminal and at least one second signal terminal, and a wire connecting the first signal terminal and the second signal terminal is separated from a wire connecting the first power supply terminal and the second power supply terminal. Then, power supply wires and signal wires are easily laid out.

Preferably, in the semiconductor device, the board includes a plurality of first wires extending from the interconnection layer to the first terminals, the interconnection layer includes a plurality of second wires extending from the semiconductor chip to the second terminals, each of the second wires intersect some of the first wires, the second terminals are provided at respective intersection points of the second wires and the first wires, and at one of the intersection points of each of the second wires, one of the second terminals is connected to an associated one of the first wires. Then, the place on the lower face of the board from which a signal is output is changed. If the second terminal provided at a longitudinal end of the second wire is connected to the first wire, noise caused by an open stub on a high-speed signal wire is eliminated.

Preferably, in the semiconductor device, the first terminals are provided in pairs, the first terminals constituting each pair are electrically connected to each other, and each of the second terminals is connected to one of each pair of the first terminals. Then, the place on the lower face of the board from which a signal is output is more greatly changed.

Preferably, in the semiconductor device, the board includes a plurality of first wires, one end of each of the first wires is provided on an upper face of the board and is connected to an associated one of the second terminals, the board is rotatable about a rotation axis perpendicular to the upper face of the board, and said one end of each of some of the first wires is located at the same position between before and after rotation of the board, whereas said one end of each of the other first wire or wires is located at different positions between before and after rotation of the board. Then, the semiconductor device is allowed to be electrically connected to a wiring board with a complicated wiring layout.

Preferably, in the semiconductor device, a region where none of the second terminals is provided is present at an edge of the upper face of the interconnection layer, conductors for connecting the first terminals and the second terminals are provided on a lower face of the interconnection layer, and a reinforcing conductor for reinforcing the strength of the interconnection layer is provided on a portion of the lower face of the interconnection layer opposite to the region where none of the second terminals is provided. Then, the strength of the interconnection layout is maintained.

Preferably, the semiconductor device has a normal mode, an evaluation mode and an analysis mode, the interconnection layer further includes a pad to be connected to one of the first terminals, a pad fixed at an H level and a pad fixed at an L level, the normal mode is selected when the first terminals are connected to the second terminals, and one of the evaluation mode and the analysis mode is selected when one of pads for selecting one of the modes is connected to an associated one of the first terminals. For such a semiconductor device, relatively complicated analysis and evaluation are performed.

In a preferred embodiment of the present invention which will be described later, the board is a leadframe.

In another preferred embodiment of the present invention which will be described later, the semiconductor device further includes a plurality of said interconnection layers and a plurality of said semiconductor chips, the interconnection layers are spaced apart from each other on an upper face of the board, and the semiconductor chips are attached to the respective interconnection layers.

In still another preferred embodiment of the present invention which will be described later, the semiconductor device further includes a plurality of said interconnection layers and a plurality of said semiconductor chips, and the interconnection layers and the semiconductor chips are alternately laminated on an upper face of the board.

BRIEF DESCRIPTION OF THE DRAWINGS

FIGS. 6A through 6C are plan views showing connection states between wires on a board and wires on an interconnection layer in a third embodiment.

DETAILED DESCRIPTION OF THE INVENTION

Figure 1:
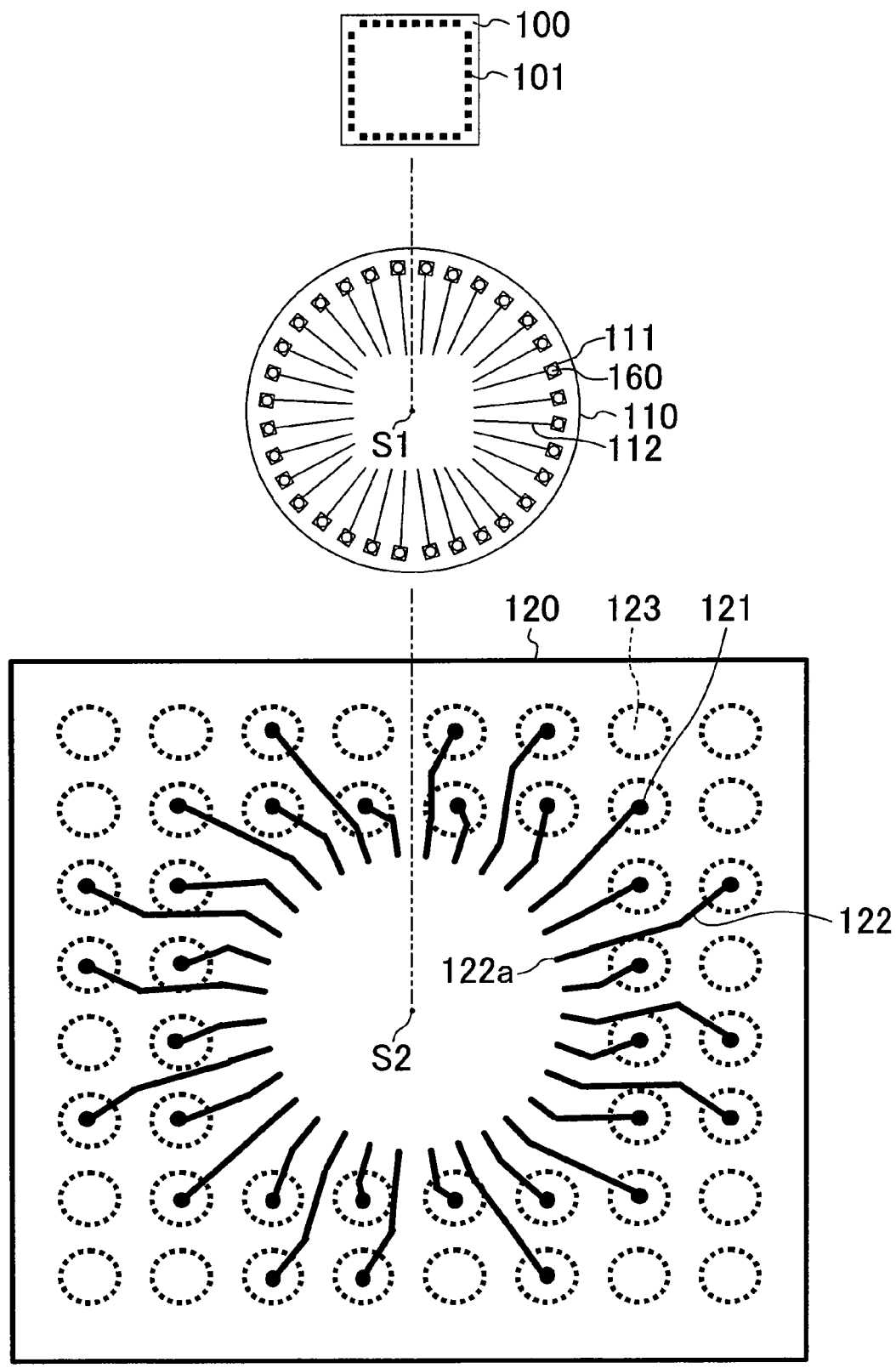
FIG. 1 is an exploded plan view of a semiconductor device according to a first embodiment.

Hereinafter, preferred embodiments of the present invention will be described with reference to the accompanying drawings. Each member with substantially the same function is identified by the same reference numeral and description thereof may not be repeated. For convenience in making the drawings, the thickness and length, for example, of each member in the drawings are different from those in actual application. The numbers and shapes of connection electrodes of a semiconductor chip, connection terminals of a board, wiring patterns, vias and other features are modified for easy representation.

Embodiment 1

A semiconductor device according to a first embodiment of the present invention will be described with reference to FIG. 1, FIGS. 2A and 2B, FIGS. 3A through 3C and FIG. 4.

Figure 2A:
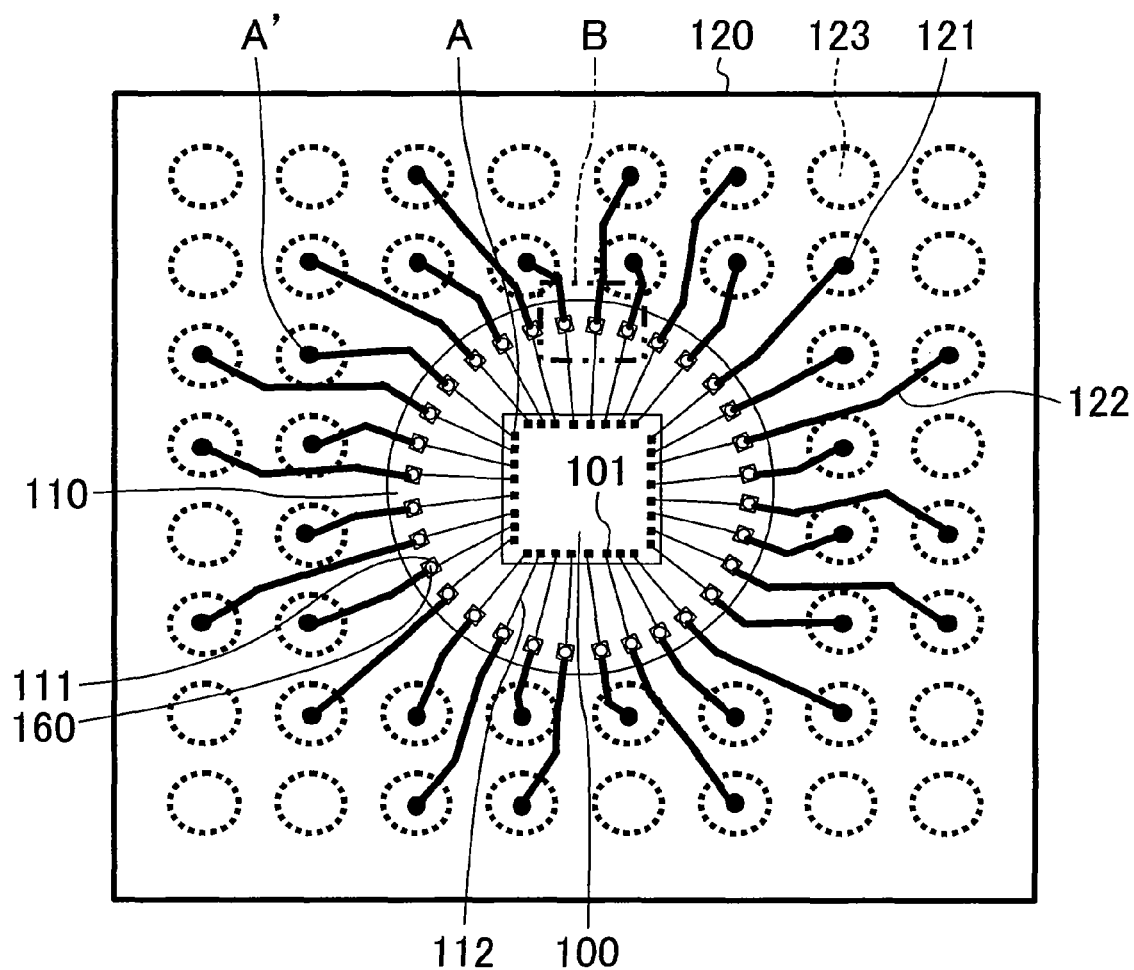
FIG. 2A is a top view of a semiconductor device according to an example of the first embodiment.
Figure 2B:
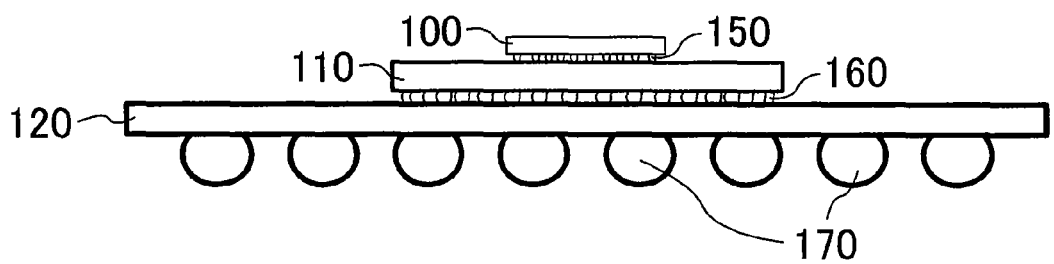
FIG. 2B is a side view thereof.
Figure 3A:
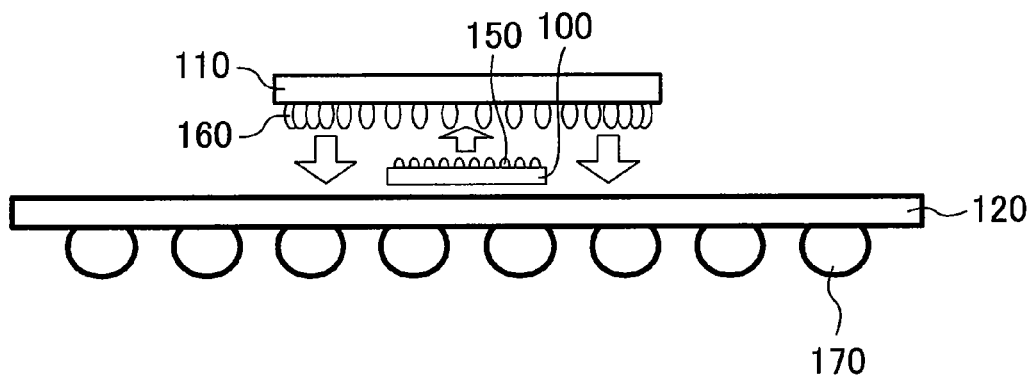
FIGS. 3A through 3C are side views of semiconductor devices different from the semiconductor device illustrated in FIG. 2B.
Figure 3B:
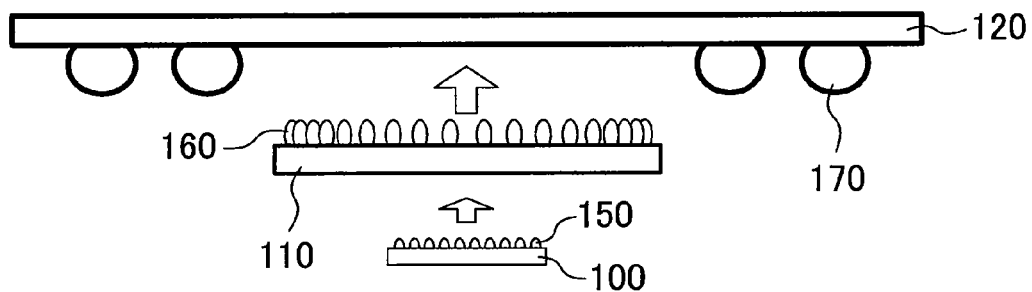
Figure 3C:
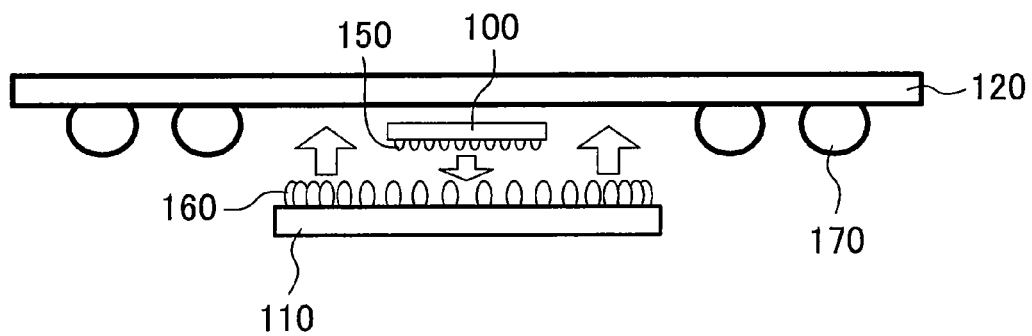
Figure 4:
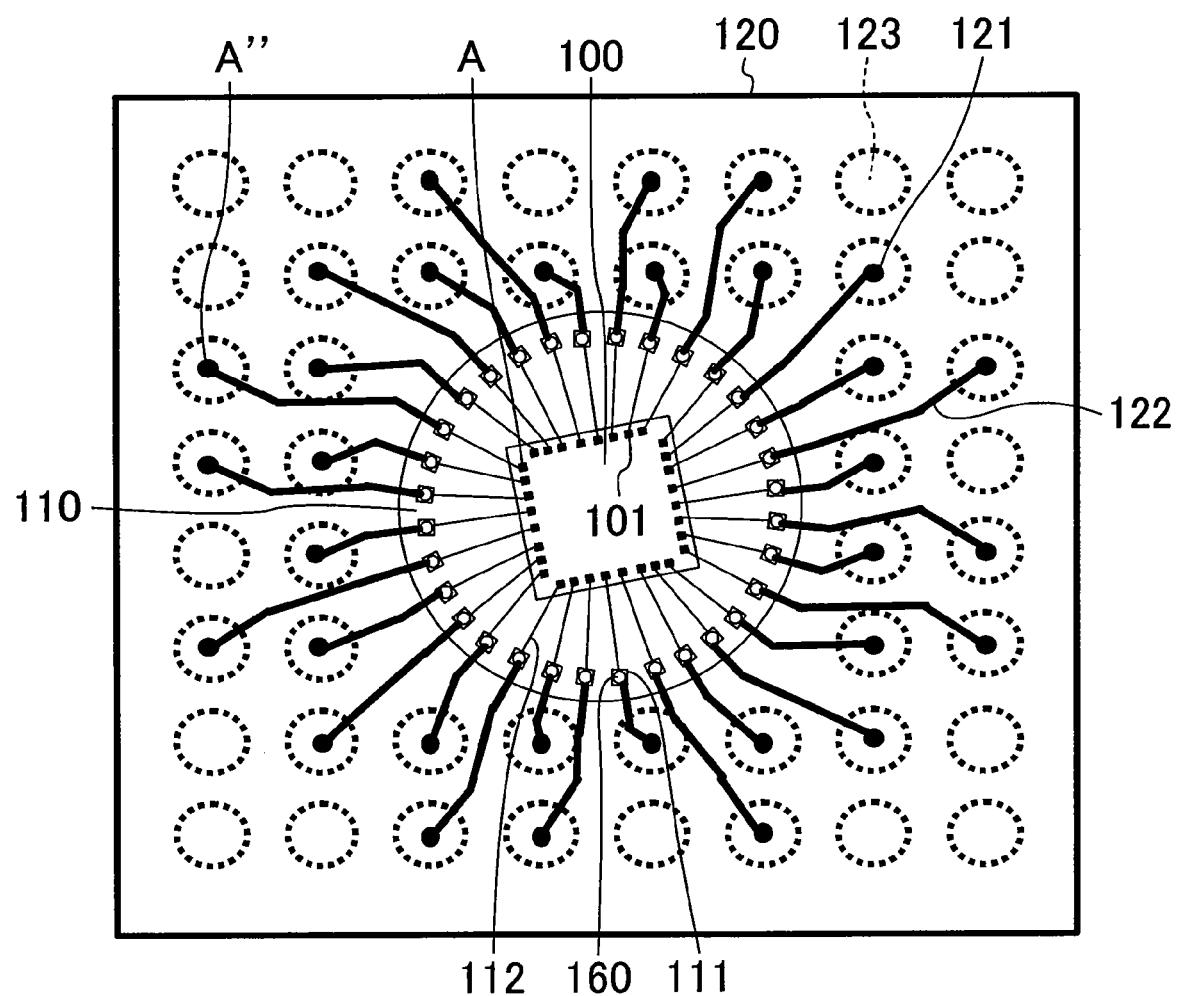
FIG. 4 is a top view of a semiconductor device according to another example of the first embodiment.

FIG. 1 is an exploded plan view of the semiconductor device of this embodiment. FIG. 2A is a top view of the semiconductor device of this embodiment. FIG. 2B is a side view of the semiconductor device of this embodiment. FIGS. 3A through 3C are side views of semiconductor devices different from the semiconductor device illustrated in FIG. 2B. FIG. 4 is a top view of a semiconductor device in which the interconnection layer is rotated from the state illustrated in FIG. 2A about an axis perpendicular to the upper face of the interconnection layer so that power supply signals and signals except for the power supply signals (hereinafter, "signals except for the power supply signals" are simply referred to as "signals") are transmitted to different places from those in FIG. 2A.

First, reference numerals in FIG. 1, FIGS. 2A and 2B, FIGS. 3A through 3C and FIG. 4 are explained.

Reference numeral 100 denotes a semiconductor chip. Reference numeral 101 denotes pads (third terminals) provided on the semiconductor chip 100. The pads 101 are composed of two types of pads: signal pads and power supply pads.

Reference numeral 110 denotes an interconnection layer. Reference numeral 111 denotes pads (second terminals) provided on the interconnection layer 110. The pads 111 penetrate the interconnection layer 110 to be arranged on the lower face of the interconnection layer 110 and are composed of two types of pads: signal pads (second signal terminals) and power supply pads (second power supply terminals). Reference numeral 112 denotes wires (second wires) extending from the semiconductor chip 100 to the pads 111. The wires 112 are used to transmit signals or power supply signals from the semiconductor chip 100 to the pads 111. The wires 112 are connected at their respective one ends to the pads 101 on the semiconductor chip 100. The end of each of the wires 112 overlaps an associated one of the pads 101 on the semiconductor chip 100 when viewed from above. Reference sign S1 denotes the center of rotation of the interconnection layer 110. The point S1 is the intersection of the rotation axis of the interconnection layer 110 and the upper face of the interconnection layer 110.

Reference numeral 120 denotes a board. Reference numeral 123 denotes pads (first terminals) provided on the lower face of the board 120. The pads 123 are electrically connected to solder balls 170. Reference numeral 121 denotes conductors connected to the pads 123 through the board 120. Reference numeral 122 denotes wires (first wires) extending from the interconnection layer 110 to the pads 123. The wires 122 are used to transmit signals or power supply signals from the interconnection layer 110 to the pads 123. Reference numeral 122a denotes ends of the respective wires 122. The wires 122 are connected at their respective ends 122a to the pads 111 on the interconnection layer 110. Each of the ends 122a of the wires 122 overlaps an associated one of the pads 111 on the interconnection layer 110 when viewed from above. Reference sign S2 denotes a point at which the rotation axis of the interconnection layer 110 and the board 120 intersect. The board 120 and the interconnection layer 110 are oriented so that the center S2 and the rotation center S1 of the interconnection layer 110 coincide with each other when viewed from above.

Reference numeral 150 denotes conductors connecting the pads 101 on the semiconductor chip 100 and the respective ends of the wires 112 on the interconnection layer 110. Reference numeral 160 denotes conductors connecting the pads 111 on the interconnection layer 110 and the respective ends 122a of the wires 122 on the board 120. The conductors 160 are connected to the pads 111 on the lower face of the interconnection layer 110 through the interconnection layer 110. Reference numeral 170 denotes solder balls provided on the lower face of the board 120.

In this embodiment and the following second through eleventh embodiments, materials for components are not specifically limited. A package used in these embodiments may or may not be covered with a molding resin. Even for a package covered with a molding resin, the molding resin is not shown in the drawings for simplicity.

Next, the semiconductor device of this embodiment is described.

In FIG. 1, the distance between the pads 101 on the semiconductor chip 100 is smaller than that in a conventional device. Thus, it is generally difficult to make the pads 101 on the semiconductor chip 100 and the associated ones of the ends 122a of the wires 122 on the board 120 overlap one another. However, the interconnection layer 110 allows the pads 101 on the semiconductor chip 100 and the respective ends of the wires 112 to overlap. Accordingly, the pads 101 on the semiconductor chip 100 and the respective one ends of the wires 112 on the interconnection layer 110 are connected to each other with microbumps, thereby electrically connecting the semiconductor chip 100 and the interconnection layer 110. On the interconnection layer 110, the wires 112 are radially provided so that the distance between the pads 111 is wider than the distance between the opposite ends of the wires 112. Accordingly, the pads 111 on the interconnection layer 110 and the respective ends 122a of the wires 122 on the board 120 overlap when viewed from above. This establishes electrical connection between the semiconductor chip 100 and the board 120 through the interconnection layer 110.

In addition, the pads 111 are arranged in rotational symmetry about the rotation center S1 on the upper face of the interconnection layer 110. The wires 122 are arranged on the upper face of the board 120 such that the ends 122a thereof are in rotational symmetry about the center S2 on the board 120

In this embodiment, the pads 111 on the interconnection layer 110 are arranged in a circle and are equally spaced. The number of the pads 111 is 32. Accordingly, if the interconnection layer 110 is rotated about the rotation axis by every 11.25° (=360°/32), the pads 111 on the interconnection layer 110 and the respective ends 122a of the wires 122 on the board 120 overlap each other so that the interconnection layer 110 is electrically connected to the board 120. In this manner, it is possible to connect the pads 101 on an identical semiconductor chip 100 to different pads 123 on the board 120 between before and after rotation of the interconnection layer 110, which will be described below.

FIGS. 2A and 2B illustrate a semiconductor device which is actually assembled. For example, "A" of the pads 101 on the semiconductor chip 100 is connected to "A" of the solder balls 170 through associated one of the conductors 150, the interconnection layer 110, an associated one of the conductors 160 and the board 120.

FIGS. 3A through 3C are side views illustrating semiconductor devices whose connection states between the semiconductor chip 100 and the interconnection layer 110 and/or connection states between the interconnection layer 110 and the board 120 are different from those shown in FIG. 2B.

In FIG. 3A, the semiconductor chip 100 is inverted from the state shown in FIG. 2B. Specifically, the semiconductor chip 100 is turned upside down and is attached to the lower face of the interconnection layer 110. The interconnection layer 110 is mounted on the upper face of the board 120 with the semiconductor chip 100 attached to the lower face of the interconnection layer 110.

In FIG. 3B, the semiconductor chip 100 and the interconnection layer 110 are inverted from the states shown in FIG. 2B. Specifically, the inverted interconnection layer 110 and the inverted semiconductor chip 100 are stacked and attached to the lower face of the board 120 in this order.

In FIG. 3C, the interconnection layer 110 is inverted from the state shown in FIG. 2B. Specifically, the semiconductor chip 100 is mounted on the upper face of the inverted interconnection layer 110 which is attached to the lower face of the board 120.

In this embodiment, the structures illustrated in FIGS. 3A through 3C have the same advantages as those of the structure illustrated in FIG. 2B, and no serious problems arise.

FIG. 4 illustrates a configuration in which the interconnection layer 110 is rotated 11.25° about the rotation axis from the state shown in FIG. 2A. As in FIG. 2A, "A" of the pads 101 on the semiconductor chip 100 is connected to one of the solder balls 170 through an associated one of the conductors 150, the interconnection layer 110, an associated one of the conductors 160 and the board 120. But, unlike FIG. 2A, the target to which "A" of the pads 101 on the semiconductor chip 100 is connected is changed from "A'" to "A''" of the solder balls 170 in FIG. 4 so that a signal or a power supply signal from "A" of the pads 101 on the semiconductor chip 100 is transmitted not to a solder ball 170 near the center of the lower face of the board 120 but to a solder ball 170 near the edge of the lower face of the board 120.

Whether the solder balls 170 are to be placed near the center of the lower face of the board 120 or near the edge thereof is determined depending on the wiring layout of, for example, a wiring board on which a semiconductor device is to be mounted. Specifically, the arrangement of the solder balls 170 is determined depending on whether wiring is provided on the surface layer of, for example, the wiring board or an internal layer of the wiring board.

In this embodiment, the interconnection layer 110 is rotated about the rotation axis from the state in which a specific pad 111 on the interconnection layer 110 is connected to a solder ball 170 located near the center of the lower face of the board 120, thereby connecting the pad 111 to a solder ball 170 located near the edge of the lower face of the board 120. Thus, an identical interconnection layer 110 is used for both cases of using, as the board 120, a board having the lower face on which solder balls 170 are provided near the center thereof and of using, as the board 120, a board having the lower face on which solder balls 170 are provided near the edge thereof. Accordingly, it is unnecessary to fabricate different types of boards 120 for different wiring layouts of, for example, wiring boards. As a result, a semiconductor device is provided at low cost and time necessary for developing the semiconductor device is shortened.

In addition, by rotating the interconnection layer 110 about the rotation axis, the places to which signals or power supply signals are transmitted are changed so that an identical board 120 is allowed to be used for semiconductor chips 100 with different arrangements of terminals in the assembly of a semiconductor device. Accordingly, cost reduction and shortening of time necessary for development of the semiconductor device are achieved by sharing the board 120.

In the first embodiment, the case of using a single board is described for simplicity. Alternatively, a plurality of boards with different arrangements of pads may be used. In the case of using a plurality of boards, rotation of the interconnection layer about the rotation axis increases flexibility in wiring layout. Accordingly, this embodiment is effective in increasing flexibility in wiring layout in the case of using a low-cost board with low flexibility in wiring layout.

Embodiment 2

Figure 5A:
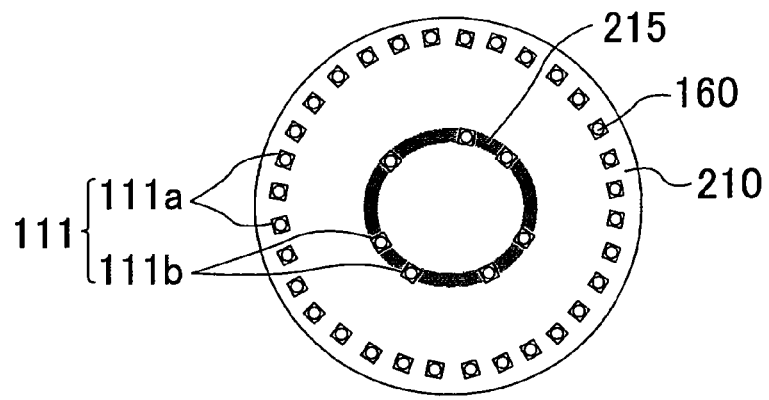
FIG. 5A is a bottom view of an interconnection layer in a second embodiment.
Figure 5B:
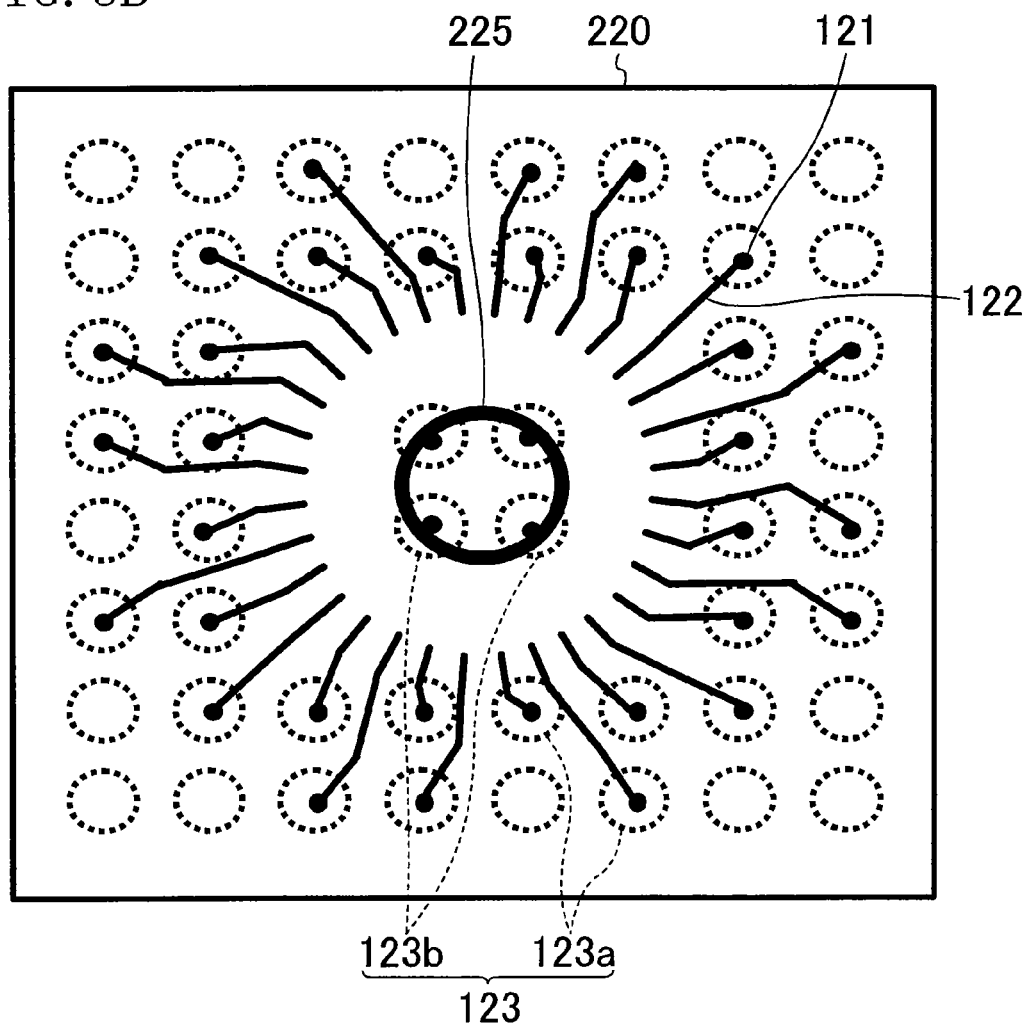
FIG. 5B is a top view of a board in the second embodiment.

In a second embodiment of the present invention, signal terminals are separated from power supply terminals in the interconnection layer of the first embodiment. This eases wiring of the signal terminals and power supply terminals in the interconnection layer. A semiconductor device according to this embodiment is described with reference to FIGS. 5A and 5B. FIG. 5A is a bottom view of an interconnection layer. FIG. 5B is a top view of a board.

First, reference numerals in FIGS. 5A and 5B are explained.

In FIG. 5A, reference numeral 210 denotes an interconnection layer, reference numeral 111a denotes signal pads (second signal terminals) provided on the interconnection layer 210, reference numeral 111b denotes power supply pads (second power supply terminals) provided on the interconnection layer 210, and reference numeral 215 denotes a wire provided on the interconnection layer 210. The wire 215 connects the power supply pads 111b together.

In FIG. 5B, reference numeral 220 denotes a board, reference numeral 123a denotes signal pads (first signal terminals) provided on the board 220, reference numeral 123b denotes power supply pads (first power supply terminals) provided on the board 220, and reference numeral 225 denotes a wire provided on the board 220. The wire 225 connects the power supply pads 123b together. The wire 225 also serves as a pad connected to conductors connecting the interconnection layer 210 and the board 220. Reference numerals 121, 122 and 123 denote the same components already described in the first embodiment.

Next, the semiconductor device of this embodiment is described.

As illustrated in FIGS. 5A and 5B, the signal pads 111a are separated from the power supply pads 111b on the interconnection layer 210. Specifically, on a semiconductor chip (not shown) of this embodiment, all the power supply terminals are provided near the center, whereas all the signal terminals are provided near the edge. Accordingly, on the interconnection layer 210 of this embodiment, the signal pads 111a are provided near the edge of the upper face of the interconnection layer 210, whereas the power supply pads 111b are provided near the center of the upper face of the interconnection layer 210.

In this arrangement, thick wires are preferably used to reduce the impedance of power supply wires. As shown in FIG. 5A, the power supply pads 111b are reinforced by the wire 215 that is circular when viewed from above at the center of the upper face of the interconnection layer 210.

The signal pads 123a are also separated from the power supply pads 123b on the board 220 connected to the interconnection layer 210. Specifically, the signal pads 123a are provided near the edge of the lower face of the board 220, whereas the power supply pads 123b are provided near the center of the lower face of the board 220. The wire 225 that is circular when viewed from above is provided to reduce the impedance of power supply wires. The board 220 is configured such that the impedance of the semiconductor device does not increase even when the interconnection layer 210 is rotated about the rotation axis. In this manner, in this embodiment, the signal pads 111a are separated from the power supply pads 111b on the interconnection layer 210 so that the impedance of the power supply wires is reduced and signal wires are easily laid out.

Embodiment 3

In a third embodiment of the present invention, arrangement of conductors connecting an interconnection layer and a board is changed so that the place on the lower face from which a signal or a power supply signal is output is more greatly changed than in the first embodiment.

A semiconductor device according to this embodiment will be described with reference to FIGS. 6A through 6C and FIG. 7. FIGS. 6A through 6C and FIG. 7 are enlarged plan views of a region B shown in FIG. 2A. The interconnection layer and the board are wire bonded in FIG. 7, but may be flip-chip bonded.

First, reference numerals in FIGS. 6A through 6C and FIG. 7 are explained.

In FIGS. 6A through 6C and FIG. 7, reference numeral 311 denotes pads (second terminals) provided on an interconnection layer, and reference numeral 312 denotes wires (second wires) extending from a semiconductor chip to the pads 311. The wires 312 are used to transmit signals or power supply signals from the semiconductor chip to the pads 311. Reference numeral 322 denotes wires (first wires) extending from the interconnection layer to the board. The wires 322 are used to transmit signals or power supply signals from the interconnection layer to the board. Reference numeral 360 in FIGS. 6A through 6C denotes conductors connecting the pads 311 and the wires 322. Reference numeral 340 in FIG. 7 denotes wires connecting the pads 311 and the wires 322.

Figure 7:
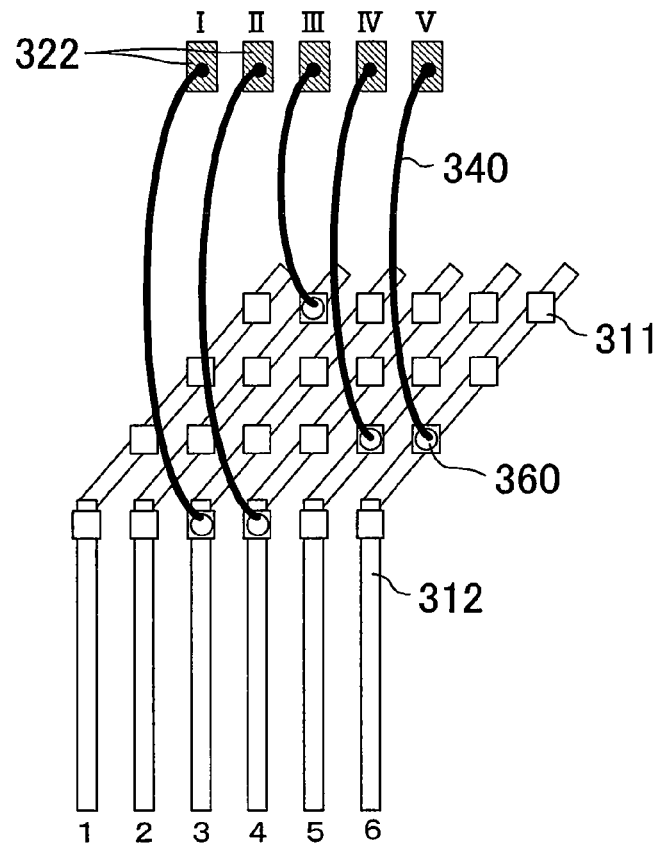
FIG. 7 is a plan view showing another connection state between wires on the board and wires on the interconnection layer in the third embodiment.

In this embodiment, the wires 312 provided on the interconnection layer are bent halfway. Specifically, in FIGS. 6A through 6C, each of the wires 312 is bent toward the positive direction of the X axis (i.e., toward the right in FIGS. 6A through 6C) at a portion where the wire 312 and an associated one of the wires 322 intersect. In FIG. 7, each of the wires 312 is bent toward the positive direction of the X axis (i.e., toward the right in FIG. 7) in a portion near an associated one of the wires 322. The pads 311 on the interconnect layer are located at the intersections of the wires 312 and the wires 322.

In FIG. 6A, the conductors 360 are connected to the second pads 311 from the bottom of the drawing out of the pads 311 on the interconnection layer. Specifically, the wires 312 and the wires 322 are connected as 1-I, 2-II, 3-III, 4-IV, 5-V and 6-* where "1-I" means that "1" of the wires 312 is connected to "I" of the wires 322 and "6-*" means that "6" of the wires 312 is connected to none of the wires 322 shown in FIG. 6A.

Three of the six conductors 360 are provided at different places between FIGS. 6A and 6B. Specifically, in FIG. 6B, the wires 312 and the wires 322 are connected as 1-I, 2-IV, 3-II, 4-III, 5-V and 6-*. In this manner, the places to which "2", "3" and "4" of the wires 312 are connected are different between FIGS. 6A and 6B.

In FIG. 6C, the interconnection layer is rotated about the rotation axis as described in the first embodiment. As a result, the wires 312 shift toward the left in the drawing. Specifically, the wires 312 and the wires 322 are connected as 1-*, 2-III, 3-I, 4-II, 5-IV and 6-V. In this manner, the first embodiment is combined with the third embodiment (i.e., the positions of the conductors 360 are changed to change the places to which the wires 312 are connected), thereby changing the places on the lower face of the board from which signals or power supply signals are output. Accordingly, demands for a printed circuit board or other components are satisfied without a change of the wiring layout of the board.

In FIG. 7, the same advantages as those of FIGS. 6A through 6C are obtained by changing the places to which the wires 340 are connected.

Embodiment 4

In a fourth embodiment of the present invention, noise caused by an open stub of a high-speed signal wire is eliminated in the third embodiment so as to improve electrical characteristics of a semiconductor device.

Figure 8:
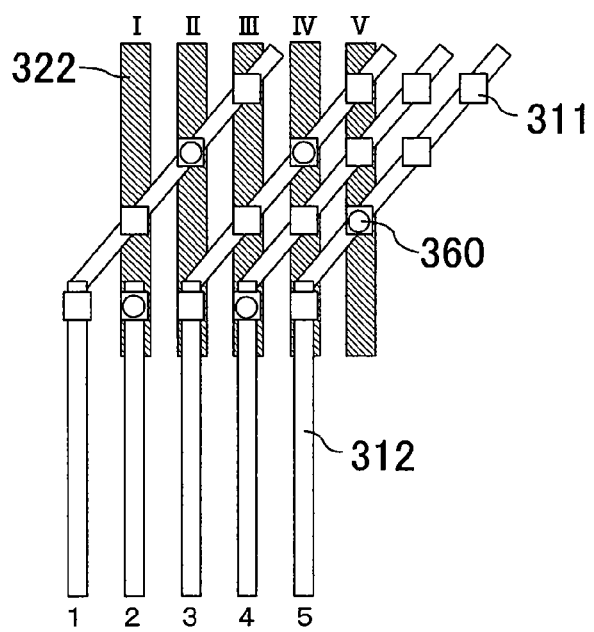
FIG. 8 is a plan view showing a connection state between wires on a board and wires on an interconnection layer in a fourth embodiment.

A semiconductor device according to this embodiment will be described with reference to FIG. 8. FIG. 8 is an enlarged plan view of the region B in FIG. 2A. Reference numerals 311, 312, 322 and 360 in FIG. 8 are already explained in the third embodiment.

In FIG. 8, "2" of the wires 312 shown in FIGS. 6A through 6C is shortened so that "2" of the wires 312 and the "I" of the wires 322 are connected. First, "2" of the wires 312 serving as a high-speed signal wire is connected to "I" of the wires 322. Then, the other wires 312 are connected to the wires 322 except for "I" in the manner described in the third embodiment.

As a result, comparing "2" and "4" of the wires 312, "4" of the wires 312 extends from a portion thereof connected to "III" of the wires 322 and thus is affected by noise caused by an open stub, whereas a portion of "2" of the wires 312 extending from a portion connected to "I" of the wires 322 is cut away so that noise caused by an open stub is reduced.

Since "2" of the wires 312 is cut off at a portion thereof connected to "I" of the wires 322 in this manner, the target to which "2" of the wires 312 itself is connected cannot be changed. However, "2" of the wires 312 is connected to "I" of the wires 322 first with priority over the other wires 312. This eliminates the necessity of changing the connection target of "2" of the wires 312, thus enabling reduction of noise caused by an open stub.

Embodiment 5

In a fifth embodiment of the present invention, a board has two receiving portions for one signal from an interconnection layer. The positions of conductors connecting the interconnection layer and wires on the board are changed so that places to which signals are transmitted are more greatly changed than in the first embodiment.

Figure 9:
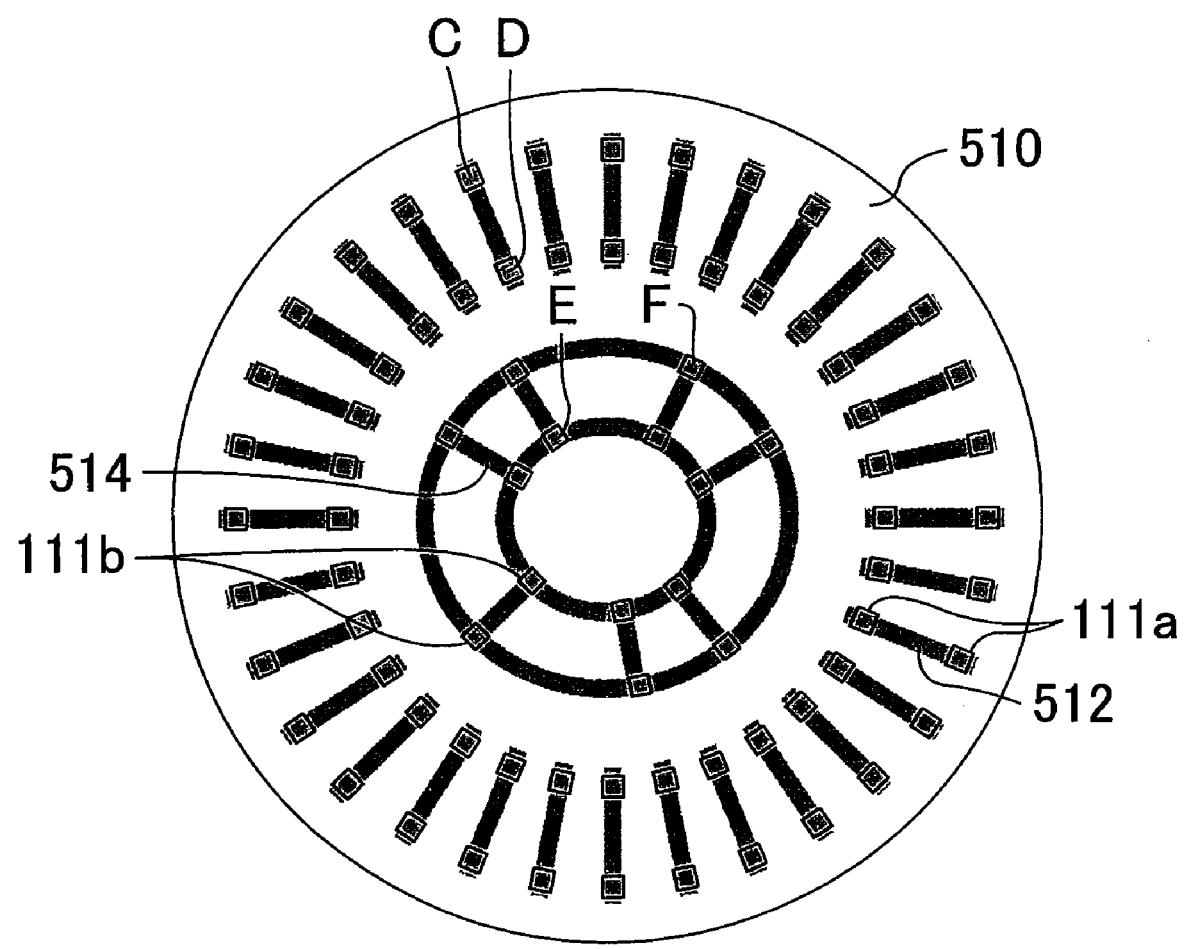
FIG. 9 is a bottom view showing an arrangement on an interconnection layer in a fifth embodiment.
Figure 10:
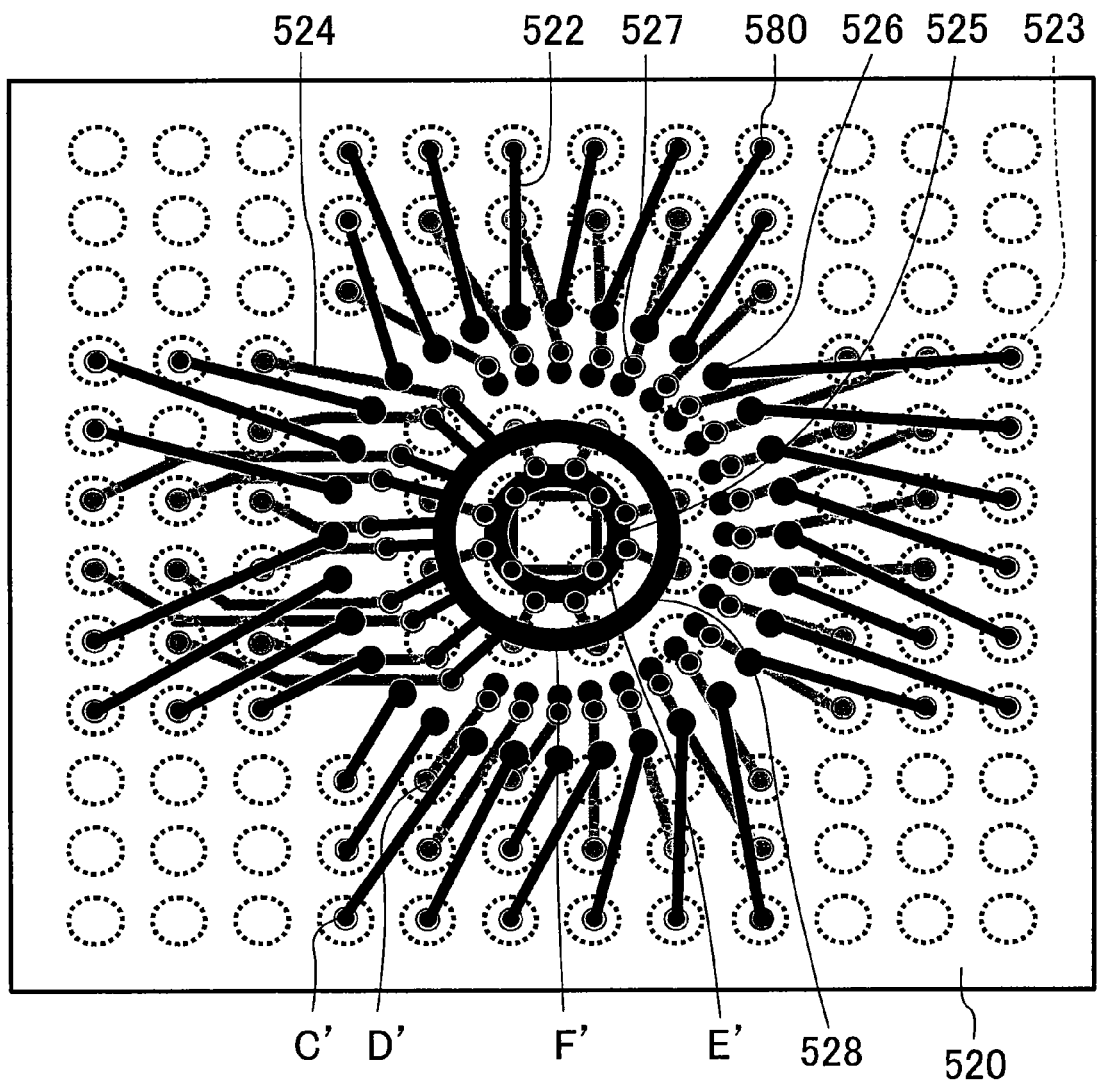
FIG. 10 is a top view of a board in the fifth embodiment.
Figure 11:
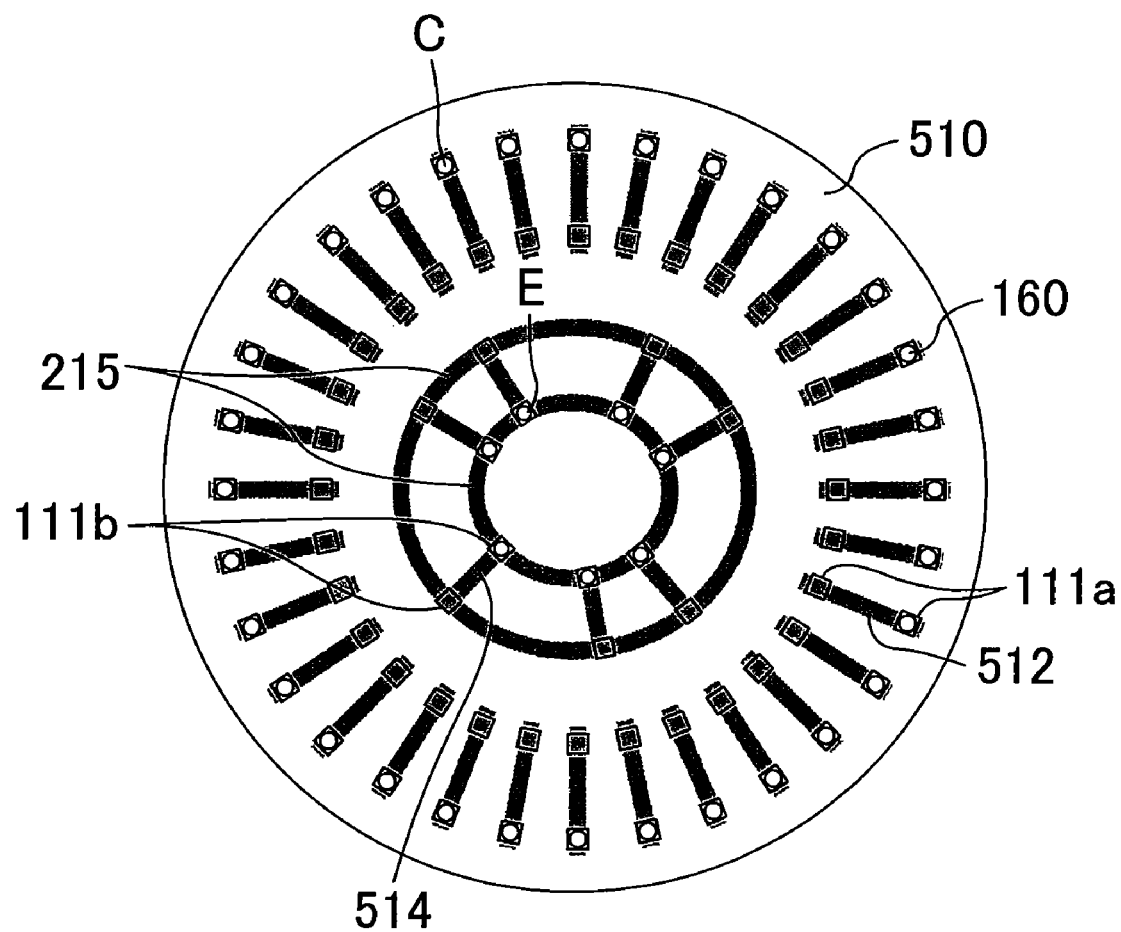
FIG. 11 is a bottom view showing another arrangement on the interconnection layer in the fifth embodiment.
Figure 12:
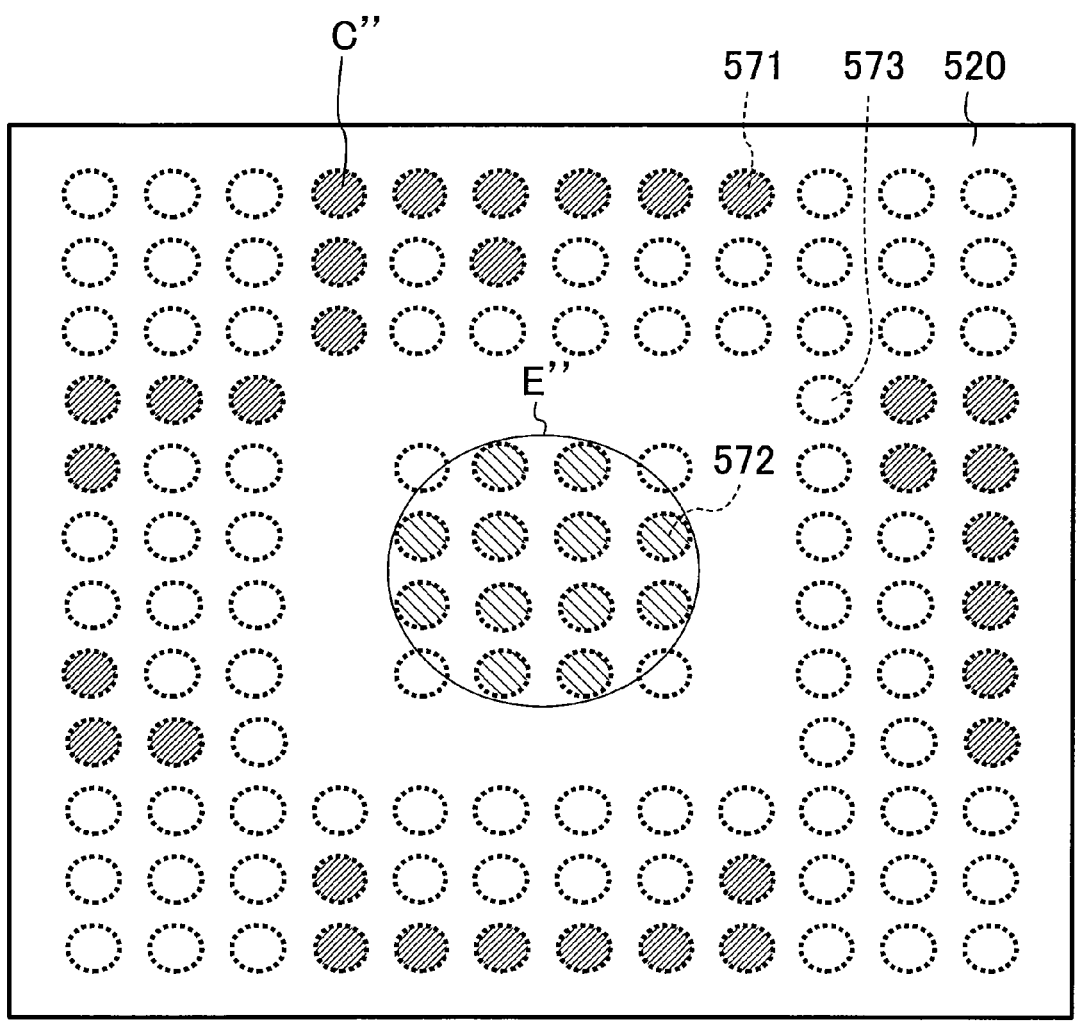
FIG. 12 is a bottom view showing an arrangement on a board in the fifth embodiment.
Figure 13:
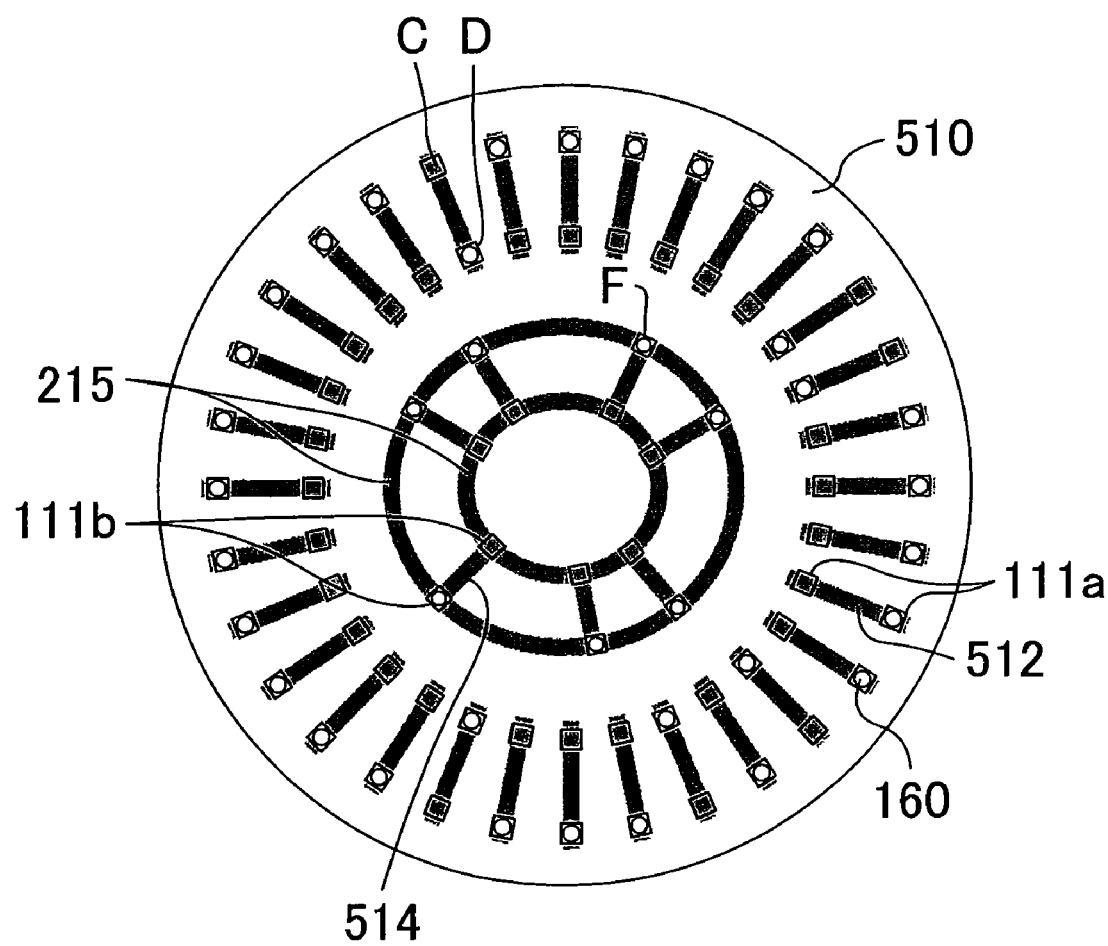
FIG. 13 is a bottom view showing yet another arrangement on the interconnection layer in the fifth embodiment.
Figure 14:
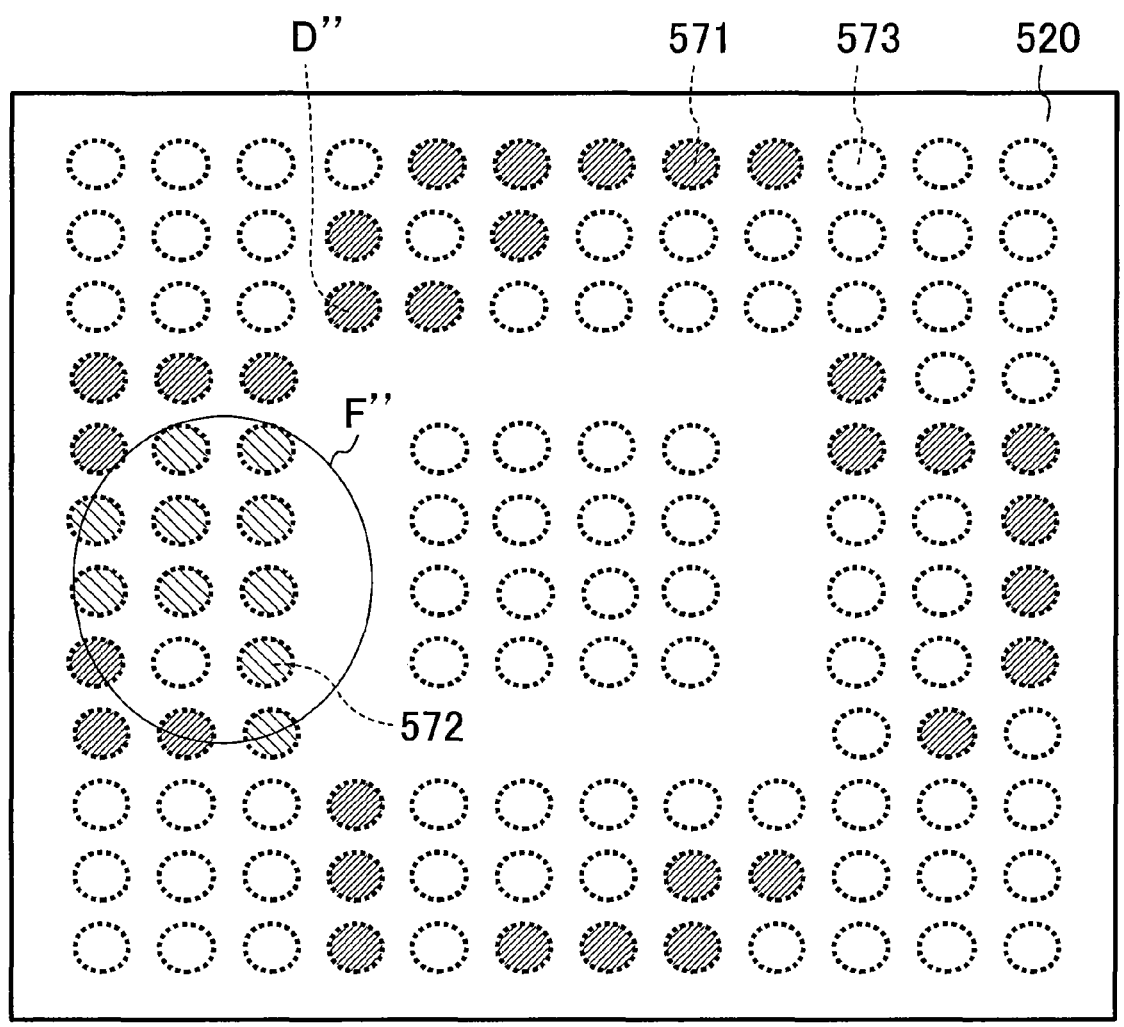
FIG. 14 is a bottom view showing another arrangement on the board in the fifth embodiment.

A semiconductor device according to this embodiment will be described with reference to FIGS. 9 and 14. FIG. 9 is a bottom view of an interconnection layer. FIG. 10 is a top view of a board to which the interconnection layer illustrated in FIG. 9 is connected. FIGS. 11 and 12 are a bottom view of an interconnection layer and a bottom view of a board, respectively, according to a modified example of this embodiment. FIGS. 13 and 14 are a bottom view of an interconnection layer and a bottom view of a board, respectively, according to another modified example of this embodiment.

First, reference numerals in FIGS. 9 through 14 are explained.

In FIGS. 9, 11 and 13, reference numeral 510 denotes an interconnection layer, reference numeral 512 denotes signal wires, and reference numeral 514 denotes power supply wires. A pair of signal pads 111a and 111a is connected to one signal wire 512. A pair of power supply pads 111b and 111b is connected to one power supply wire 514.

In FIG. 10, reference numeral 520 denotes a board, reference numeral 522 denotes wires provided on the upper face of the board 520, reference numeral 523 denotes pads (first terminals) provided on the lower face of the board 520, and reference numeral 524 denotes wires provided on the lower face of the board 520. The pads 523 are composed of two types of pads: signal pads and power supply pads. Reference numerals 525 and 528 denote wires each connecting power supply pads together on the board 520. The wires 525 and 528 also serve as pads connected to conductors connecting the interconnection layer 510 and the board 520. Reference numerals 526 and 527 denote signal pads provided on the board 520. Reference numeral 580 denotes conductors penetrating through the board 520 along the thickness thereof.

In FIGS. 12 and 14, reference numeral 520 denotes a board, reference numeral 571 denotes solder balls connected to signal wires, reference numeral 572 denotes balls connected to power supply wires, reference numeral 573 denotes solder balls in an open state, i.e., which are not connected to any component.

Next, a semiconductor device according to this embodiment is described.

As shown in FIG. 9, a pair of signal pads 111a and 111a is connected to one signal wire 512 and a pair of power supply pads 111b and 111b is connected to one power supply wires 514 on the interconnection layer 510. The numbers of the signal pads 111a and the power supply pads 111b are not limited to those shown in FIG. 9.

As shown in FIG. 10, the power supply pads are arranged to form a double circle near the center of the upper face of the board 520 connected to the interconnection layer 510. The inner power supply pads are connected together by the wire 525 and the outer power supply pads are connected together by the wire 528. The signal pads 526 and 527 are arranged to form a double circle near the edge of the upper face of the board 520.

The conductors 580 penetrate the board 520 along the thickness thereof. The conductors 580 are connected to the wires 522 at the upper face of the board 520 and are connected to the wires 524 at the lower face of the board 520. The wires 522 are connected to the wires 525 and 528 and the signal pads 526 and 527 described above. The wires 524 are connected to the pads 523.

As shown in FIG. 10, wires used when signals from the interconnection layer 510 are received by the signal pads 527 and wires used when signals from the interconnection layer 510 are received by the signal pads 526 are provided on the board 520. Signals received by the signal pads 526 and 527 on the board 520 are both transmitted to the pads 523 through the wires 522, the conductors 580 and the wires 524.

In addition, as shown in FIG. 10, two types of wires are provided, i.e., wires used when power supply signals from the interconnection layer 510 are received by the wire 525 and wires used when these power supply signals are received by the wire 528 are provided on the board 520. Signals received by the wires 525 and 528 are both transmitted to the pads 523 through the wires 522, the conductors 580 and the wires 524.

To locate all the signal wires 512 near the edge of the upper face of the interconnection layer 510 and all the power supply wires 514 near the center of the upper face of the interconnection layer 510, conductors 160 are provided to the signal pads 111a at the outer side of the pairs of signal pads 111a and 111a and to the power supply pads 111b at the inner side of the pairs of power supply pads 111b and 111b on the interconnection layer 510, as shown in FIG. 11. In this arrangement, solder balls on the lower face of the board 520 are arranged as shown in FIG. 12.

To locate some of the signal wires 512 near the center of the upper face of the interconnection layer 510 and all the power supply wires 514 near the edge of the upper face of the interconnection layer 510, the conductors 160 are arranged in a manner as shown in FIG. 13. In this arrangement, solder ball on the lower face of the board 520 are arranged as shown in FIG. 14.

Now, description focuses on "C" and "D" of the signal pads 111a on the interconnection layer 510.

On the interconnection layer 510 shown in FIG. 11, a conductor 160 is provided to "C" of the signal pads 111a which is connected to "C'" of the solder balls in FIG. 12 through "C" of the signal pads 527 on the board 520 in FIG. 10. On the other hand, on the interconnection layer 510 shown in FIG. 13, a conductor is provided to "D" of the signal pads 111a which is connected to "D'" of the solder balls in FIG. 14 through "D'" of the signal pads 527 on the board 520 in FIG. 10. In this manner, the positions of the conductors 160 on the interconnection layer 510 are changed, thus providing a plurality of wiring patterns.

Then, description focuses on "E" and "F" of the power supply pads 111b on the interconnection layer 510.

On the interconnection layer 510 shown in FIG. 11, a conductor 160 is provided to "E" of the power supply pads 111b which is connected to a solder ball provided on a region E" shown in FIG. 12 through "E'" of the wire 525 in FIG. 10. On the other hand, on the interconnection layer 510 shown in FIG. 13, a conductor 160 is provided to "F" of the power supply pads 111b which is connected to a solder ball provided on a region F" shown in FIG. 14 through "F'" of the wires 528 in FIG. 10.

In this manner, in this embodiment, the wiring layout of the board 520 is more complicated than that in the first embodiment, but the positions on the board 520 from which signals are output are more greatly changed than in the first embodiment. Accordingly, the structure of this embodiment can cope with a complicated wiring layout of, for example, a printed board.

Embodiment 6

Figure 15:
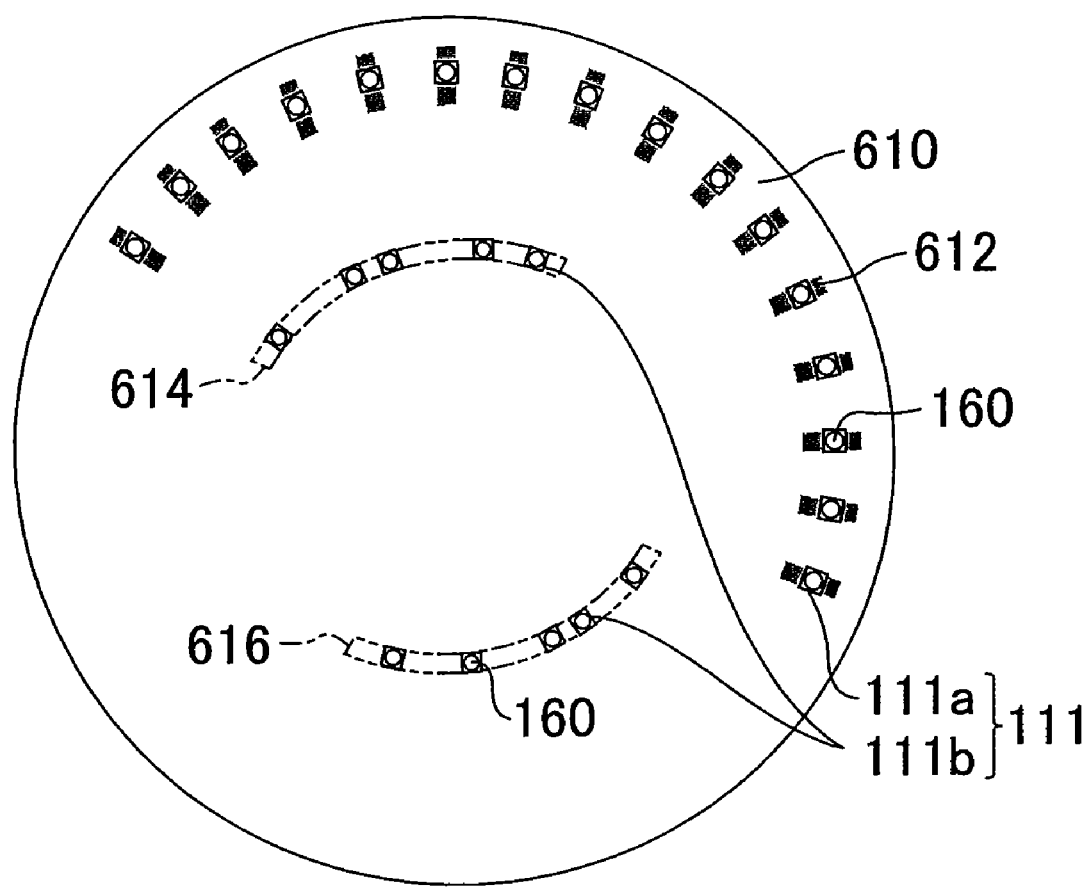
FIG. 15 is a bottom view of an interconnection layer in a sixth embodiment.
Figure 16A:
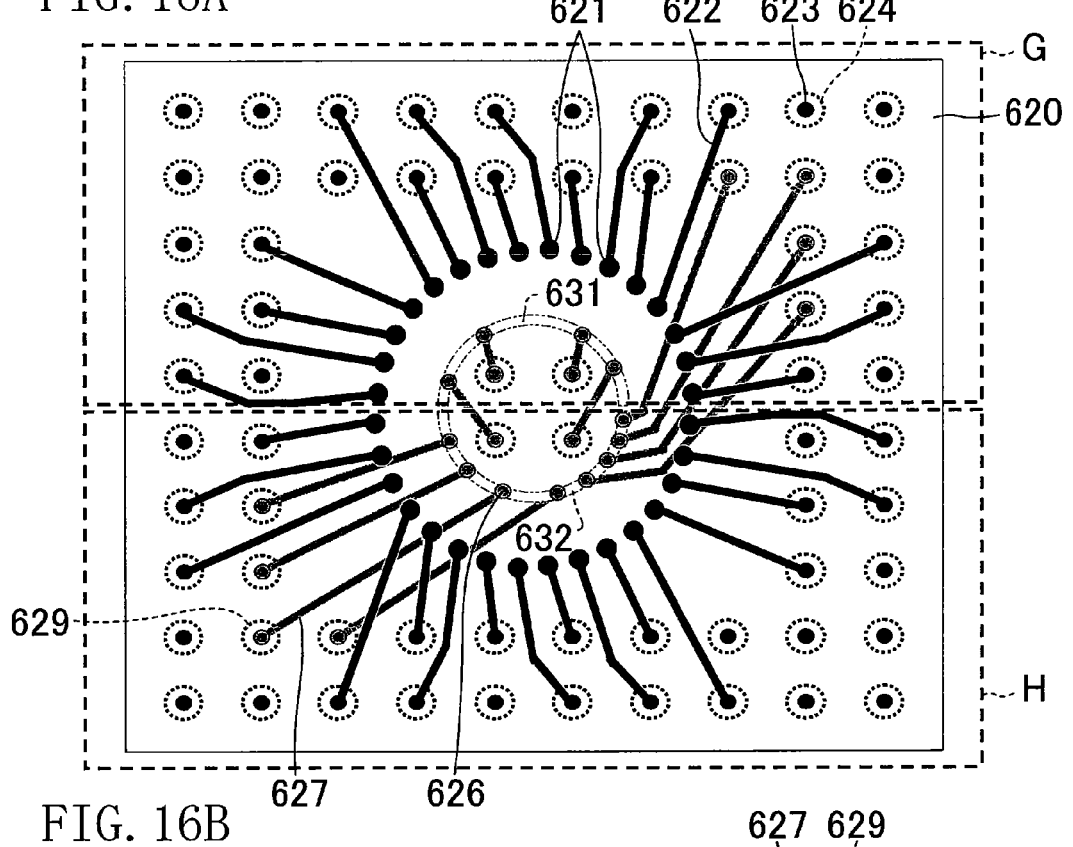
FIG. 16A is a top view of a board in the sixth embodiment.
Figure 16B:
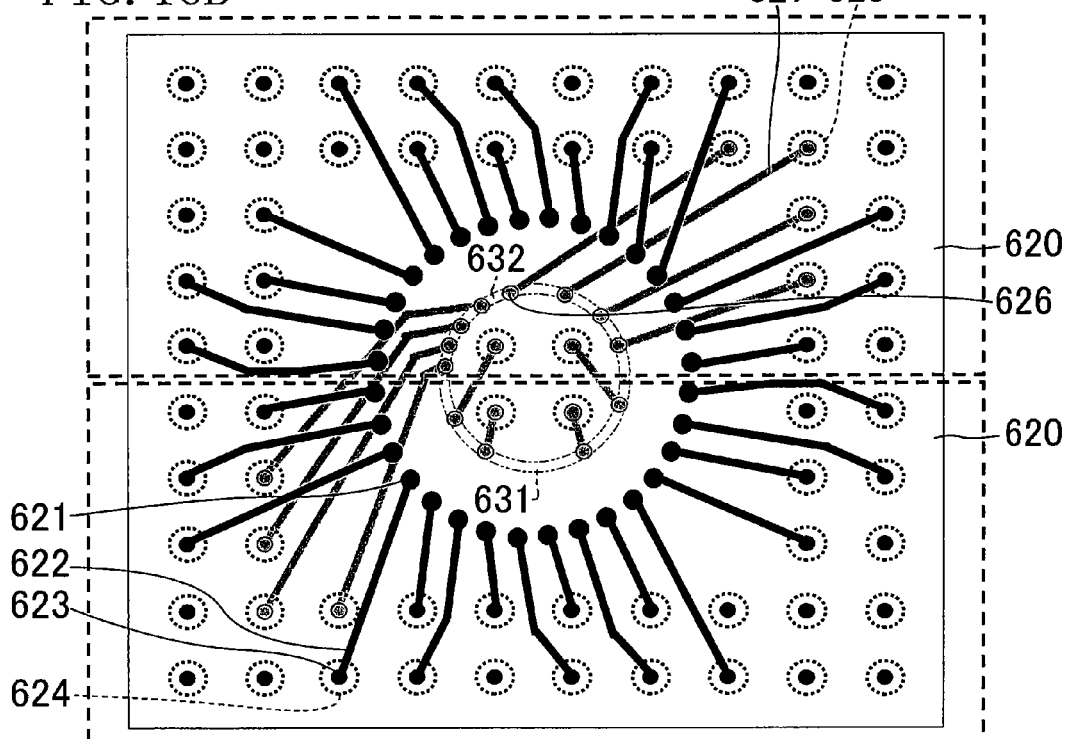
FIG. 16B is a top view of a board rotated 180° about a rotation axis from the state shown in FIG. 16A.

A sixth embodiment of the present invention is different from the first embodiment in that the arrangement of only specific signal wires is changed. A semiconductor device according to this embodiment is described with reference to FIG. 15 and FIGS. 16A and 16B. FIG. 15 is a bottom view of an interconnection layer. FIGS. 16A and 16B are top views of a board. The board shown in FIG. 16B is rotated 180° about the rotation axis from the state shown in FIG. 16A.

First, reference numerals in FIG. 15 and FIGS. 16A and 16B are explained.

In FIG. 15, reference numeral 610 denotes an interconnection layer and reference numeral 612 denotes signal wires. Reference numerals 111, 111a, 111b and 160 denote the same components in the first embodiment. The signal pads 111a are provided on an upper half of the upper face of the interconnection layer 610 in FIG. 15 but may be provided in any form on the upper face of the interconnection layer 610 as long as the signal pads 111a are connected to first terminals on a board.

In FIGS. 16A and 16B, reference numeral 620 denotes a board, reference numeral 621 denotes signal pads, reference numeral 622 denotes signal wires, reference numeral 623 denotes conductors, and reference numeral 624 denotes signal pads (first signal terminals) provided on the lower face of the board 620. The signal pads 621 are connected to the signal pads 624 through the signal wires 622 and the conductors 623. Reference numeral 626 denotes conductors, reference numeral 627 denotes power supply wires, and reference numeral 629 denotes power supply pads (first power supply terminals) provided on the lower face of the board 620. Reference numerals 631 and 632 denote power supply wires provided on the board 620. The power supply wires 631 and 632 also serve as pads connected to conductors connecting the interconnection layer 610 and the board 620. Though the power supply wires 631 and 632 are connected to the power supply pads 629 through the conductors 626 and the power supply wires 627, the power supply wires 631 are separated from the power supply wires 632 because the power supply wires 631 and 632 have different potentials.

As shown in FIG. 15, in this embodiment, the signal pads 111a are provided in a half area of the upper face of the interconnection layer 610 and are located near the edge of the upper face of the interconnection layer 610. The power supply pads 111b are located near the center of the upper face of the interconnection layer 610 and are provided in two parts according to different potentials. Power supply pads 614 located in the upper part in FIG. 15 are connected to VDD, whereas power supply pads 616 located in the lower part in FIG. 15 are connected to VSS.

As shown in FIGS. 16A and 16B, in this embodiment, the power supply wires 631 and 632 are located near the center of the upper face of the board 620, whereas the signal pads 621 are located near the edge of the upper face of the board 620. The power supply wires 631 located in the upper half shown in FIG. 16A are connected to the power supply pads located near the center of the board 620, whereas the power supply wires 631 located in the lower half in FIG. 16A are connected to the power supply pads located near the edge of the board 620. A region H on the board 620 shown in FIG. 16A is in a state in which a region G is rotated 180° about the rotation axis except for wires extending from the power supply wires 631 and 632 to the power supply pads.

In fabricating a semiconductor device using the interconnection layer 610 and board 620 of this embodiment, the interconnection layer 610 is placed above the board 620 shown in FIG. 16A and then is rotated about the rotation axis to obtain an optimum wire pattern. The angle of rotation of the interconnection layer 610 about the rotation axis needs to be equal to or greater than 0° and less than 90°. If the rotation angle is 90° or greater, the power supply pads 614 on the interconnection layer 610 are adversely connected to both of the power supply wires 631 and the power supply wires 632 on the board 620 so that power the supply pads 616 on the interconnection layer 610 are connected to both of the power supply wires 631 and the power supply wires 632 on the board 620, thus causing short circuit between the power supply pads 614 and the power supply pads 616. On the other hand, if the rotation angle is less than 90°, the power supply pads 614 on the interconnection layer 610 are connected to either the power supply wires 631 or 632 on the board 620 so that the power supply pads 616 on the interconnection layer 610 are connected to the other power supply wires 631 or 632 on the board 620, thus suppressing short circuit occurring between the power supply pads 614 and the power supply pads 615 through the power supply wires 631 and 632.

Then, when the board 620 shown in FIG. 16A is rotated 180° about the rotation axis, the power supply wires 631 are replaced with the power supply wires 632 as shown in FIG. 16B. Accordingly, the positions of the power supply pads (first power supply terminals) on the board 620 to which the power supply pads 614 and 615 on the interconnection layer 610 in FIG. 15 are connected are replaced with each other. Since the signal pads on the interconnection layer 610 are in point symmetry, the positions of these signal pads are, of course, not changed even when the interconnection layer 610 are rotated 180° and only the positions of VDD and VSS are replaced with each other.

In this embodiment, as described above, the interconnection layer 610 are rotated about the rotation axis to obtain an optimum wiring pattern so that only arrangement of power supply wires is changed without a change of arrangement of signal wires on the board 620. Accordingly, this embodiment is applicable even to a complicated wiring layout of, for example, a wiring board, as compared to the first embodiment.

In this embodiment, signal wires are distinguished from power supply wires for simplicity. However, only specific signal wires may be in asymmetric. Even in such a case, the same advantages are obtained.

The rotation angle of the board is not limited to 180°.

Embodiment 7

Figure 17:
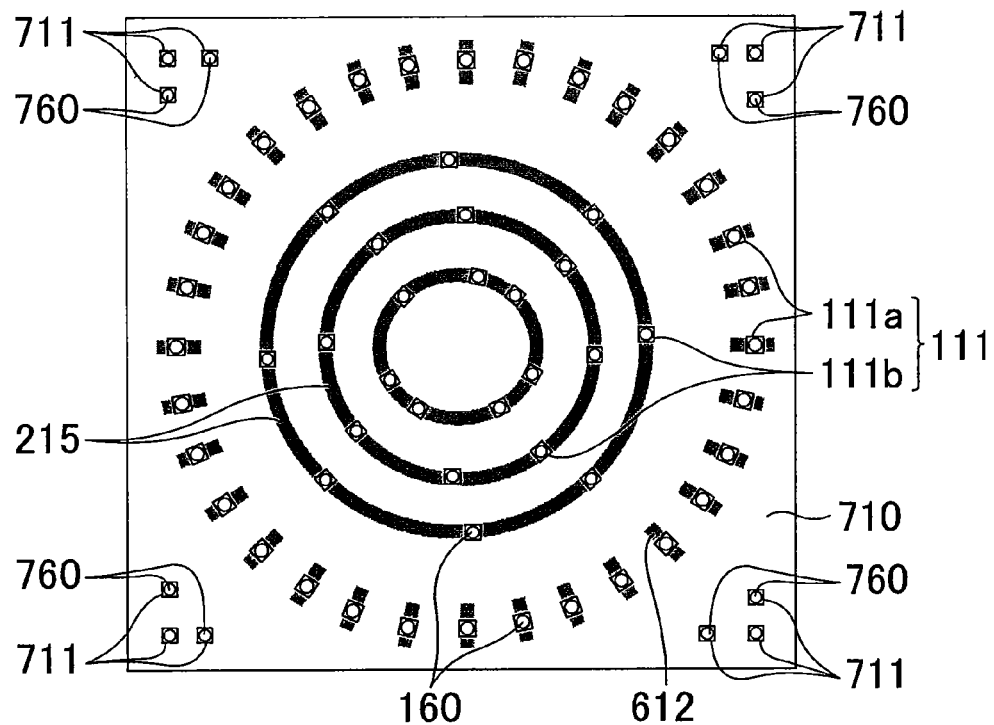
FIG. 17 is a bottom view of an interconnection layer in a seventh embodiment.

In a seventh embodiment of the present invention, the shape of the interconnection layer of the first embodiment is modified. A semiconductor device according to this embodiment will be described with reference to FIG. 17. FIG. 17 is a bottom view of an interconnection layer of this embodiment.

Now, reference numerals in FIG. 17 are explained. In FIG. 17, reference numeral 710 denotes an interconnection layer, reference numeral 711 denotes dummy pads and reference numeral 760 denotes reinforcing conductors for reinforcing the interconnection layer. Reference numerals 111, 111a, 111b, 160 and 215 are already explained in the first embodiment.

In FIG. 17, the interconnection layer 710 is rectangular in plan view. If dicing into the interconnection layer 710 is taken into consideration, the interconnection layer 710 is preferably rectangular rather than circular in plan view.

In general, for the interconnection layer having a rectangular shape in plan view, when pads are arranged in rotational symmetry about the center of the upper face of the interconnection layer as in the first embodiment, a region where no pads are provided (hereinafter, referred to as a no-pad region) arises at every corner of the rectangle. Since no pads are provided on the no-pad region, no conductors connected to pads are provided, either. Accordingly, in the presence of such no-pad regions at the four corners of the rectangle, the no-pad regions and other regions are not balanced in pouring an underfill material so that voids might occur. The presence of such no-pad regions at the corners of the rectangle also causes failure in maintaining the strength of the interconnection layer so that the reliability of the semiconductor device decreases below the standard in some cases.

In view of this, in this embodiment, the dummy pads 711 are provided on the four corners of the upper face of the interconnection layer 710 and the reinforcing conductors 760 for reinforcing the interconnection layer are provided for the respective dummy pads 711. Then, even in the case of using an interconnection layer having a rectangular shape in plan view as the interconnection layer 710, the reliability of the semiconductor device is maintained.

Embodiment 8

Figure 18:
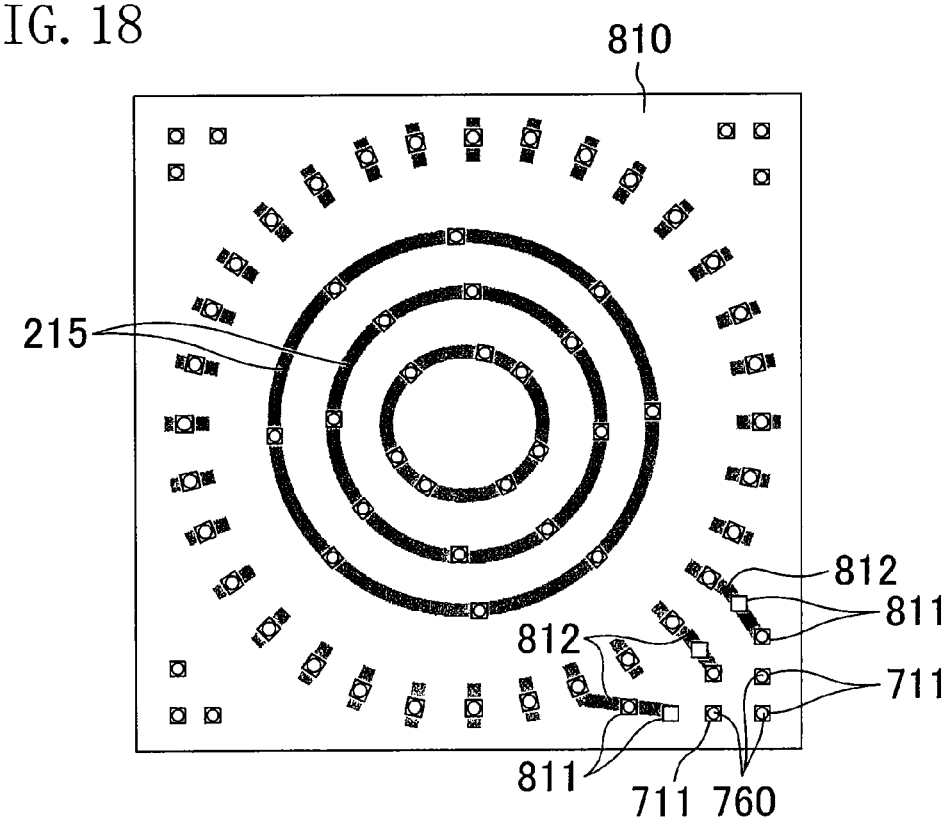
FIG. 18 is a bottom view of an interconnection layer in an eighth embodiment.

In an eighth embodiment of the present invention, the function of fixing specific terminals of the interconnection layer of the first embodiment at high (H) or low (L) is added. A semiconductor device according to this embodiment will be described with reference to FIG. 18. FIG. 18 is a bottom view of an interconnection layer of this embodiment.

Now, reference numerals in FIG. 18 are explained. In FIG. 18, reference numeral 810 denotes an interconnection layer, reference numeral 811 denotes mode switching terminals, and reference numeral 812 denotes signal wires. Reference numerals 111, 111*a*, 111*b*, 160, 215, 711 and 760 are already explained in the first and seventh embodiments.

In this embodiment, three signal wires are set at H or L by using a space (i.e., the lower-right space of the interconnection layer 810 in FIG. 18) on the lower face of the interconnection layer 810. Though an interconnection layer having a rectangular shape in plan view is used as the interconnection layer 810 in FIG. 18, the planar shape of the interconnection layer 810 is not specifically limited.

In this embodiment, though not shown, a terminal (mode switch) for inputting an analysis mode and an evaluation mode is provided on a semiconductor chip. The mode switch has three terminals and switches the mode according to the combination of H and L levels of the terminals.

Such mode switching terminals are also provided on the interconnection layer 810. Specifically, three types of pads 811, 811 and 811 (i.e., a pad to be connected to a ball, a pad fixed at H and a pad fixed at L) are provided on the interconnection layer 810. The mode is determined according to the pad on which a conductor 160 connecting the interconnection layer 810 and a board is provided out of the ball-connected pad, the H-fixed pad and the L-fixed pad. If unnecessary, the ball-connected pad may be open. Each of the ball-connected pad, the H-fixed pad and the L-fixed pad is fixed at H or L through a high resistance. Each of the pads is set to shift to the normal mode when being in an open state.

In operating the semiconductor device in the normal mode, the interconnection layer 810 is rotated about the rotation axis to change the connection targets as disclosed in the first and other embodiments. In operating the semiconductor device in the evaluation mode or the analysis mode, the interconnection layer 810 is not rotated about the rotation axis but is fixed at the angle shown in FIG. 18 so that the arrangement of the conductors 160 connecting the interconnection layer 810 and the board is changed, thereby switching the mode among a plurality of modes such as an evaluation 1 mode, an evaluation 2 mode, an analysis 1 mode and an analysis 2 mode. This enables more complicated analysis and evaluation, thus reducing the number of process steps for analysis and evaluation.

Embodiment 9

Figure 19:
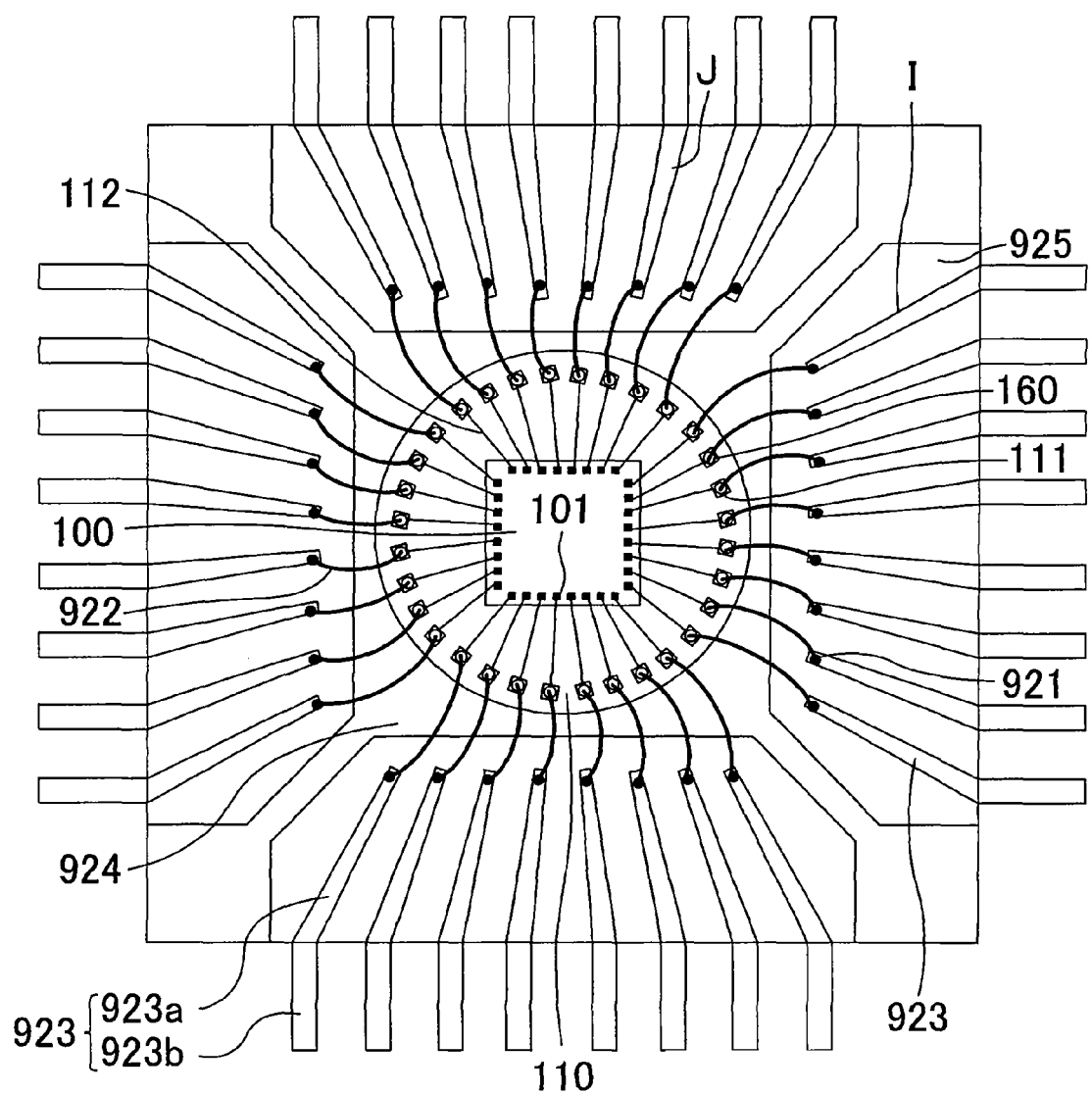
FIG. 19 is a top view of a semiconductor device according to a ninth embodiment.

In a ninth embodiment of the present invention, the board of the first embodiment is replaced with a leadframe. A semiconductor device according to this embodiment will be described with reference to FIG. 19. FIG. 19 is a top view of the semiconductor device of this embodiment.

Now, reference numerals in FIG. 19 are explained. Leads 923 and a die pad 924 are connected by a frame (not shown) before assembly of a leadframe. In the assembly, the leads 923 and the die pad 924 are fixed with a resin and then the frame is cut away. Then, the leads 923 and the die pad 924 are insulated from each other. Reference numeral 921 denotes pads provided on the upper faces of the leads 923. Reference numeral 922 denotes wires extending from an interconnection layer 110 to the pads 921. Reference numeral 923*a* denotes inner leads and reference numeral 923*b* denotes outer leads. Reference numeral 925 denotes an encapsulating resin. Reference numerals 100, 101, 110, 111 and 112 are already explained in the first embodiment.

In the semiconductor device of this embodiment, the interconnection layer 110 is mounted on the die pad 924 and the semiconductor chip 100 is mounted on the interconnection layer 110. The leads 923 are encapsulated with the encapsulating resin 925 such that the outer leads 923*b* of the leads 923 are exposed.

The structure of the interconnection layer 110 of this embodiment is substantially the same as that of the interconnection layer 110 of the first embodiment. Thus, when the interconnection layer 110 is rotated about the rotation axis, the place to which a pad 111 is connected is greatly changed from "I" to "J" of the leads 923, for example.

Embodiment 10

Figure 20:
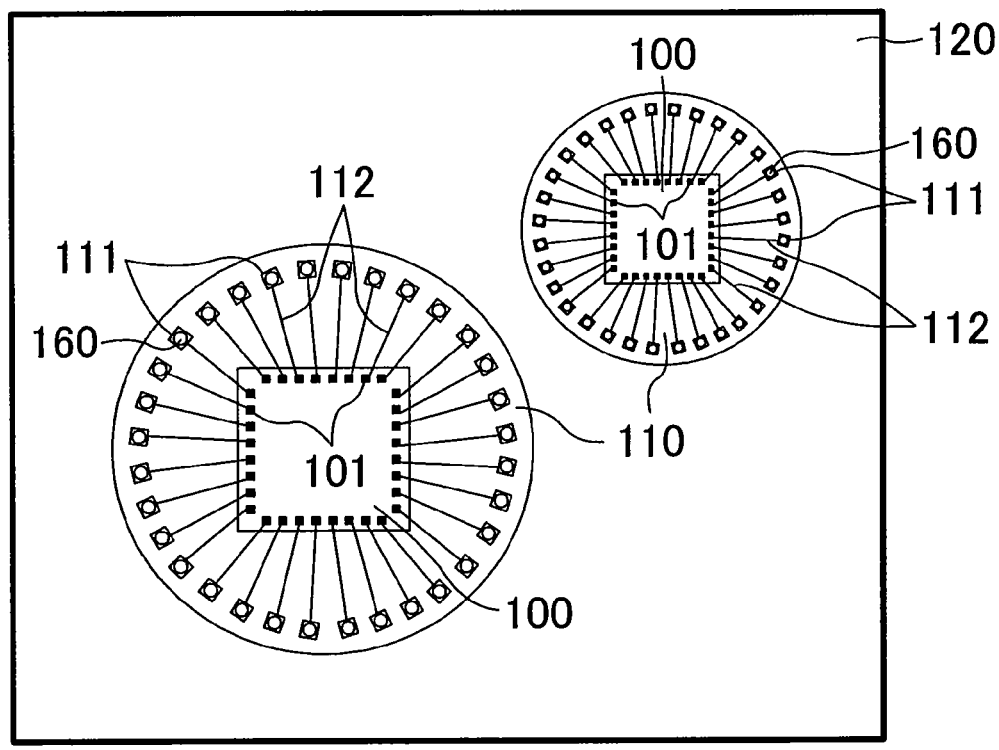
FIG. 20 is a top view of a semiconductor device according to a tenth embodiment.

In a tenth embodiment of the present invention, a semiconductor device includes a plurality of interconnection layers. The semiconductor device of this embodiment will be described with reference to FIG. 20. FIG. 20 is a top view of the semiconductor device of this embodiment.

In the semiconductor device of this embodiment, a plurality of interconnection layers 110 and 110 are provided apart from each other on the upper face of a board 120. This reduces mismatch in portions to which signals are transmitted by utilizing wiring layouts of the interconnection layers 110 and rotating the interconnection layers 110 even when semiconductor chips with different wiring layouts are attached to the board.

Though two interconnection layers are mounted on the board in FIG. 20, the number of interconnection layers is not specifically limited.

Semiconductor chips may be mounted on the lower faces of the interconnection layers.

Embodiment 11

Figure 21:
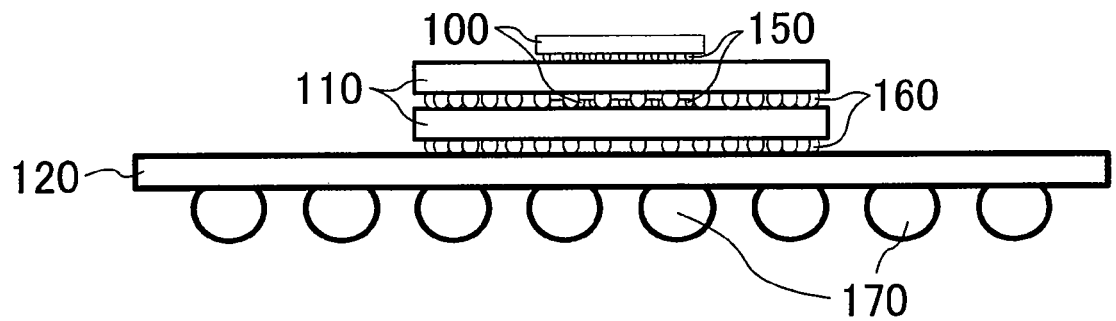
FIG. 21 is a side view of a semiconductor device according to an eleventh embodiment.

In an eleventh embodiment of the present invention, a semiconductor device includes a plurality of interconnection layers and a plurality of semiconductor chips. A semiconductor device according to this embodiment will be described with reference to FIG. 21. FIG. 21 is a side view of the semiconductor device of this embodiment.

In the semiconductor device of this embodiment, interconnection layers 110 and semiconductor chips 100 are alternately laminated on the upper surface of a board 120. This allows the interconnection layers with different wiring layouts to be individually rotated about respective rotation axes. Accordingly, as in the tenth embodiment, mismatch in portions to which signals are transmitted is reduced by utilizing wiring layouts of the interconnection layers and rotating the interconnection layers.

Though two interconnection layers are mounted on the board in FIG. 21, the number of interconnection layers is not specifically limited.

The semiconductor chips may be mounted on the lower faces of the respective interconnection layers.

What is claimed is:

1. A semiconductor device, comprising:
   a board;
   a plurality of first terminals provided on the board;
   an interconnection layer attached to the board;
   a plurality of second terminals provided on the interconnection layer and connected to the first terminals through the board;
   a semiconductor chip attached to the interconnection layer; and
   a plurality of third terminals provided on the semiconductor chip and connected to the second terminals,
   wherein the interconnection layer is rotatable about a rotation axis perpendicular to an upper face of the interconnection layer, and
   a first terminal having a specific function out of the first terminals and a third terminal having the specific function out of the third terminals are connected to each other by rotating the interconnection layer.

2. The semiconductor device of claim 1, wherein a plurality of first wires are provided on the board,
   the second terminals are provided on one of the upper face and a lower face of the interconnection layer and are in rotational symmetry about an intersection point of the rotation axis and the interconnection layer,
   one ends of the respective first wires are arranged in rotational symmetry about an intersection point of the rotation axis and the board,
   each of said one ends of the respective first wires is connected to and overlaps one of the second terminals, and
   each of the third terminals is connected to different ones of the first terminals between before and after rotation of the interconnection layer.

3. The semiconductor device of claim 1, further comprising a plurality of types of boards with different arrangements of the first terminals,
   wherein each of the third terminals is connected to different ones of the first terminals on each of the boards between before and after rotation of the interconnection layer.

4. The semiconductor device of claim 1, wherein the first terminals are provided on a lower face of the board and are composed of at least one first power supply terminal and at least one first signal terminal,
   the second terminals are provided on the upper face of the interconnection layer and are composed of at least one second power supply terminal and at least one second signal terminal, and
   a wire connecting the first signal terminal and the second signal terminal is separated from a wire connecting the first power supply terminal and the second power supply terminal.

5. The semiconductor device of claim 1, wherein the board includes a plurality of first wires extending from the interconnection layer to the first terminals,
   the interconnection layer includes a plurality of second wires extending from the semiconductor chip to the second terminals,
   each of the second wires intersect some of the first wires, the second terminals are provided at respective intersection points of the second wires and the first wires, and
   at one of the intersection points of each of the second wires, one of the second terminals is connected to an associated one of the first wires.

6. The semiconductor device of claim 5, wherein said one of the second terminals connected to said associated one of the first wires is located at a longitudinal end of an associated one of the second wires.

7. The semiconductor device of claim 1, wherein the first terminals are provided in pairs,
   the first terminals constituting each pair are electrically connected to each other, and
   each of the second terminals is connected to one of each pair of the first terminals.

8. The semiconductor device of claim 1, wherein the board includes a plurality of first wires,
   one end of each of the first wires is provided on an upper face of the board and is connected to an associated one of the second terminals,
   the board is rotatable about a rotation axis perpendicular to the upper face of the board, and
   said one end of each of some of the first wires is located at the same position between before and after rotation of the board, whereas said one end of each of the other first wire or wires is located at different positions between before and after rotation of the board.

9. The semiconductor device of claim 1, wherein a region where none of the second terminals is provided is present at an edge of the upper face of the interconnection layer,
   conductors for connecting the first terminals and the second terminals are provided on a lower face of the interconnection layer, and
   a reinforcing conductor for reinforcing the strength of the interconnection layer is provided on a portion of the lower face of the interconnection layer opposite to the region where none of the second terminals is provided.

10. The semiconductor device of claim 1, wherein the semiconductor device has a normal mode, an evaluation mode and an analysis mode,
    the interconnection layer further includes a pad to be connected to one of the first terminals, a pad fixed at an H level and a pad fixed at an L level,
    the normal mode is selected when the first terminals are connected to the second terminals, and
    one of the evaluation mode and the analysis mode is selected when one of pads for selecting one of the modes is connected to an associated one of the first terminals.

11. The semiconductor device of claim 1, wherein the board is a leadframe.

12. The semiconductor device of claim 1, further comprising a plurality of said interconnection layers and a plurality of said semiconductor chips,
    wherein the interconnection layers are spaced apart from each other on an upper face of the board, and
    the semiconductor chips are attached to the respective interconnection layers.

13. The semiconductor device of claim 1, further comprising a plurality of said interconnection layers and a plurality of said semiconductor chips,
    wherein the interconnection layers and the semiconductor chips are alternately laminated on an upper face of the board.

* * * * *